US008724054B2

(12) United States Patent
Jones

(10) Patent No.: US 8,724,054 B2
(45) Date of Patent: May 13, 2014

(54) HIGH EFFICIENCY AND LONG LIFE OPTICAL SPECTRUM CONVERSION DEVICE AND PROCESS

(76) Inventor: Gary Wayne Jones, Newcastle, WA (US)

( * ) Notice: Subject to any disclaimer, the term of this patent is extended or adjusted under 35 U.S.C. 154(b) by 891 days.

(21) Appl. No.: 12/788,680

(22) Filed: May 27, 2010

(65) Prior Publication Data

US 2011/0025951 A1   Feb. 3, 2011

Related U.S. Application Data

(60) Provisional application No. 61/181,447, filed on May 27, 2009.

(51) Int. Cl.
*G02F 1/13357* (2006.01)
*H01J 1/62* (2006.01)

(52) U.S. Cl.
USPC .................. 349/70; 349/71; 313/110; 362/84

(58) Field of Classification Search
USPC .............. 349/70, 71; 362/84, 582, 97.1, 97.2; 372/70; 313/503, 504, 110
See application file for complete search history.

(56) References Cited

U.S. PATENT DOCUMENTS

| | | | |
|---|---|---|---|
| 6,295,106 B1 * | 9/2001 | Fukuzawa et al. | 349/71 |
| 8,040,028 B2 * | 10/2011 | Kanade et al. | 313/117 |
| 2005/0041174 A1 | 2/2005 | Numata et al. | |
| 2005/0093430 A1 * | 5/2005 | Ibbetson et al. | 313/501 |
| 2005/0264715 A1 * | 12/2005 | Kahen et al. | 349/61 |
| 2006/0007791 A1 | 1/2006 | Bamdad | |
| 2006/0227532 A1 * | 10/2006 | Ko et al. | 362/85 |
| 2006/0238671 A1 | 10/2006 | Kim et al. | |
| 2007/0058107 A1 * | 3/2007 | Im et al. | 349/71 |
| 2007/0103069 A1 | 5/2007 | Manuela et al. | |
| 2007/0201800 A1 | 8/2007 | Shin | |
| 2008/0310805 A1 | 12/2008 | Sugizaki et al. | |
| 2009/0103872 A1 | 4/2009 | Lu | |

* cited by examiner

*Primary Examiner* — Dung Nguyen
*Assistant Examiner* — Tai Duong
(74) *Attorney, Agent, or Firm* — Schmeiser, Olsen & Watts, LLP

(57) ABSTRACT

A spectral conversion device including a plurality of discrete units dyed with a photoluminescent material at a concentration greater than or equal to an amount sufficient to absorb and convert substantially all input light from a light source to a desired output spectrum, and a coating material disposed around the discrete units, wherein the coating material binds the plurality of discrete units to form a matrix, wherein when the plurality of discrete units are positioned over the light source, the input light passing through the transparent discrete units is not converted, and the input light passing through the doped discrete units is converted to red and green wavelengths, further wherein the emitted input light and the converted red and green light correspond to the desired output spectrum to produce one or more colors. An associated method and an associated device used with flat panel image displays are also provided.

42 Claims, 22 Drawing Sheets

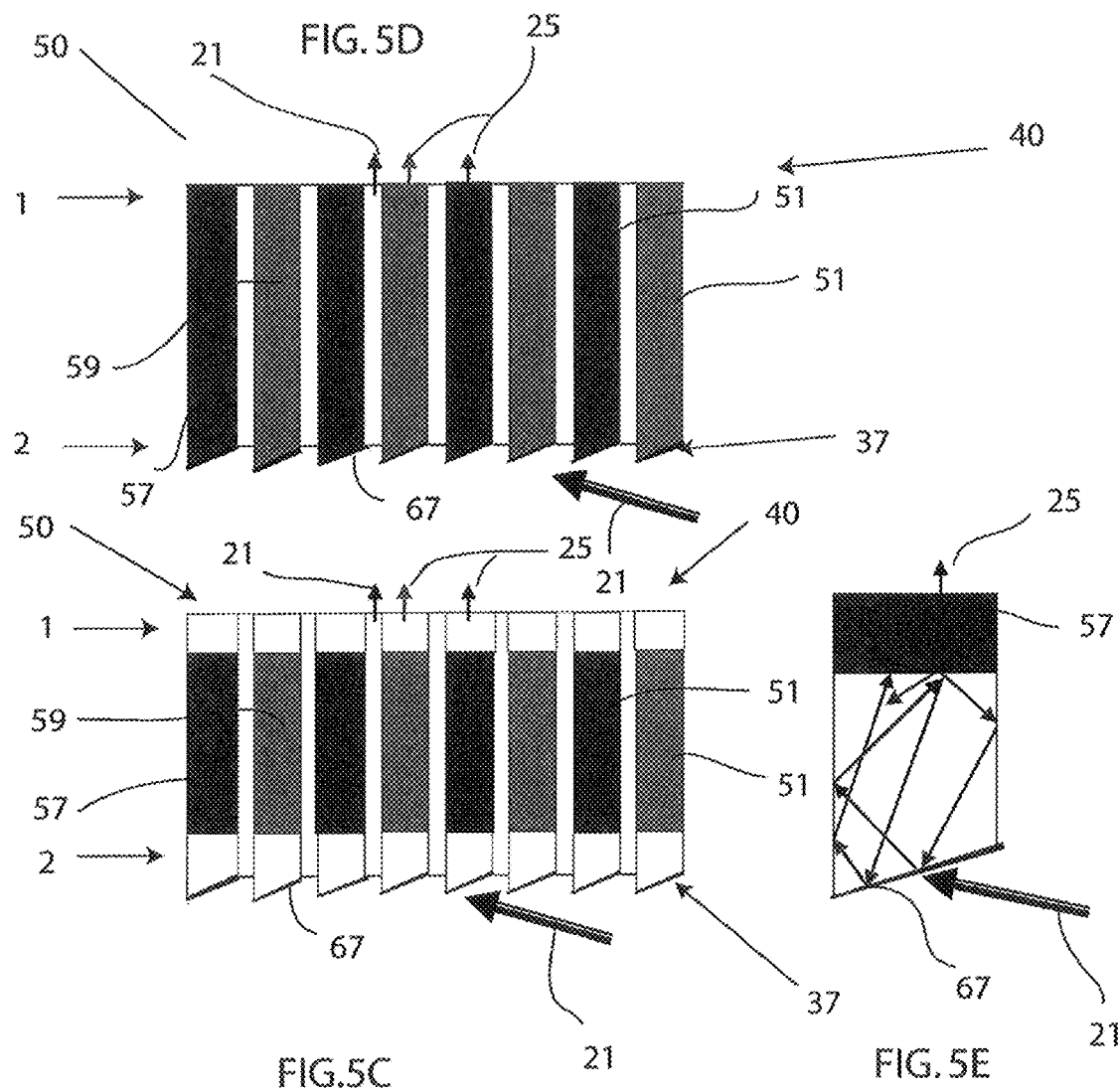

HIGH EFFICIENCY AND LONG LIFE OPTICAL SPECTRUM CONVERSION DEVICE AND PROCESS

RELATED APPLICATIONS

This non-provisional application claims priority to a U.S. Provisional Application Ser. No. 61/181,447 filed May 27, 2009 with the United States Patent and Trademark Office.

FIELD OF TECHNOLOGY

The following relates generally to an apparatus and method for increasing the useful life and energy efficiency of spectral conversion, more specifically to embodiments of a photoluminescent color converter matrix.

BACKGROUND OF TECHNOLOGY

Prior white-light and multicolor light emitting diode (LED) lighting color conversion processes involving inorganic phosphor powders waste a substantial portion of the photons from the LED due to light scattering, light trapping, and quantum yield conversion losses in most photoluminescent phosphor matrix structures. The high index of refraction and birefringence of many inorganic phosphor grains cause light scattering, preventing the majority of visible light from being emitted in the forward direction. Light scattering and light trapping within a color converter and LED combination is a problem associated with white LED lighting because it can lead to an overall waste of photons, as well as reduction in energy efficiency in a white light emitting LED lamp.

Moreover, some organic photoluminescent materials have exhibited very high conversion efficiencies with over 90% quantum yields, yielding high overall energy efficiencies for converted white-LEDs. However, after short periods of time after exposure to high intensity UV or blue light, these organic photoluminescent materials become increasingly transparent to blue light which results in an increase in transmitted blue light with a matched reduction in the emission spectrum.

Almost all organic and inorganic color conversion materials have exhibited broader than desirable color spectrum to be competitive with the color quality needed for high color range flat panel displays. Furthermore, light directionality of color converted lights has been limited by the omni-directional light emission characteristics of these color converters.

Thus, there is a need for a spectral color conversion apparatus and method that reduces light scattering and light trapping, improves quantum yield, provides choice of directionality of light, and increases the energy efficiency in white LED-lighting and the like, while still providing the potential for long luminance lifetime.

SUMMARY

A first aspect relates generally to a spectral conversion device comprising a plurality of discrete units, the plurality of discrete units including transparent discrete units and dyed discrete units, wherein the dyed discrete units are dyed with a photoluminescent material at a concentration greater than or equal to an amount sufficient to absorb and convert substantially all input light from a light source to a desired output spectrum, and a coating material disposed around the plurality of discrete units, wherein the coating material binds the plurality of discrete units to form a matrix, further wherein a thickness of the coating material determines the distance between each of the plurality of discrete units, wherein when the plurality of discrete units are positioned over the light source, the input light passing through the transparent discrete units is not converted, and the input light passing through the doped discrete units is converted to red and green wavelengths, further wherein the emitted input light and the converted red and green light correspond to the desired output spectrum to produce one or more colors.

A second aspect relates generally to a spectral conversion device comprising one or more photoluminescent color conversion matrices corresponding to an individual color element of an image display device having a plurality of light switches, wherein the one or more photoluminescent matrices provide an output spectrum for the corresponding individual color element, wherein the photoluminescent color conversion matrices include a plurality of discrete units, the plurality of discrete units including transparent discrete units and dyed discrete units, wherein the dyed discrete units are dyed with a photoluminescent material at a concentration greater than or equal to an amount sufficient to absorb and convert substantially all input light from a light source to a desired output spectrum, and a coating material disposed around the plurality of discrete units, wherein the coating material binds the plurality of discrete units to form the color conversion matrix, further wherein a thickness of the coating material determines the distance between each of the plurality of discrete units.

A third aspect relates generally to a method of improving life and efficiency of spectral conversion comprising providing a plurality of discrete units, the plurality of discrete units including transparent discrete units and dyed discrete units, dying the dyed discrete units with a photoluminescent material at a concentration greater than or equal to an amount sufficient to absorb and convert substantially all input light from a light source to a desired output spectrum, providing a coating material around the plurality of discrete units, wherein the coating material binds the plurality of discrete units to form a matrix, further wherein a thickness of the coating material determines the distance between each of the plurality of discrete units, and positioning the plurality of discrete units proximate the light source, wherein the input light passing through the transparent discrete units is not converted, and the input light passing through the doped discrete units is converted to red and green wavelengths, further wherein the emitted input light and the converted red and green light correspond to the desired output spectrum to produce one or more colors.

A fourth aspect relates generally to transparent light pathways, light scattering pathways, and partly transparent pathways with photoluminescence or electroluminescent materials optionally used in unique ways to provide additional capabilities. These light pathways can be through the units, single or multiple coatings on the units, and/or in filler between the units. It may also include the use of large arrays of fibers or ribbons placed close together to provide light amplification of large numbers nanostructures elements placed close together.

A fifth aspect relates generally to unique structures and design concepts for integrating such units into or onto a flat panel display.

A sixth aspect relates generally to the use of full and partial reflectors incorporated into an array of units to build lasers, modulation and switching control, light amplification, and/or to isolate spectral regions of the array from each other.

A seventh aspect relates generally to a plurality of discrete units forming a matrix wherein the plurality of discrete units are doped with a photoluminscent material to achieve 80% to 95% quantum conversion efficiency.

BRIEF DESCRIPTION

Some of the embodiments of this invention will be described in detail, with reference to the following figures, wherein like designations denote like members, wherein:

FIG. 5C depicts a cross section view of a first embodiment of a discrete unit matrix with beveled ends;

FIG. 5D depicts a cross-section view of a second embodiment of discrete unit matrix with beveled ends;

FIG. 5E depicts a cross section view of an embodiment of a beveled end of the second embodiment of the discrete unit matrix interacting with input blue light;

DETAILED DESCRIPTION

Figure 1:
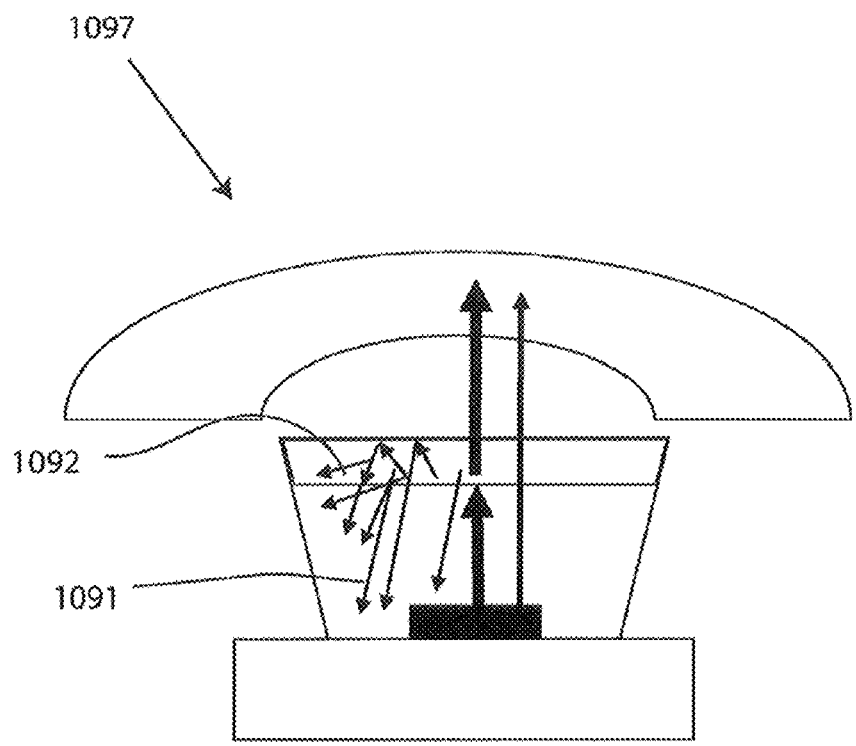
FIG. 1 depicts a schematic view of a conventional solid state white LED lamp exhibiting problems such as light scattering and light trapping.

Although certain embodiments will be shown and described in detail, it should be understood that various changes and modifications may be made without departing from the scope of the appended claims. The scope will in no way be limited to the number of constituting components, the materials thereof, the shapes thereof, the relative arrangement thereof, etc., and are disclosed simply as an example of an embodiment. The features and advantages are illustrated in detail in the accompanying drawings, wherein like reference numerals refer to like elements throughout the drawings.

Referring to drawings, FIG. 1 depicts a conventional white light emitting diode (LED) lamp 1097 exhibiting problems such as light trapping 1091 and light scattering 1092. The conventional white LED lamp 1097 typically involves the use of inorganic phosphor powders in transparent matrices, which result in substantial light trapping 1091, light scattering 1092, and a significant loss of light output. Loss of light output may lead to a reduction in energy efficiency. The color conversion processes associated with conventional white LED lighting may waste as much as 50% of the photons from the LED due to light trapping 1091, light scattering 1092, and quantum yield conversion losses. Some issues concerning conventional white LED lighting efficiency include: 1) a high index of refraction of inorganic phosphor grains causing light scattering 1092, resulting in approximately 60% of the visible light wavelengths to not be emitted in the forward direction, 2) the block design of the phosphor matrix causing light trapping 1091 which leads to a typical 10-15% loss of light, and 3) the conversion loss of an inorganic phosphor mixture in a matrix causing a typical 20-25% loss of the LED's emitted photons. The total effect of these combined inefficiencies may reach an upwards of 50% light loss for the user of a conventional solid state white LED lamp 97.

Referring generally to the drawings, most embodiments may be used with many types of light sources. In one exemplary embodiment, an LED light source may be used. In another exemplary embodiment, Organic LEDs (OLED) may be used. In yet another exemplary embodiment, laser sources including laser diodes may be used. Other light sources include, inter alia, metal halide lamps, xenon and Krypton bulbs, incandescent bulbs, arc lamps of almost any variety, plasma light sources, cathodoluminescent sources, and inorganic electroluminescent.

Furthermore, a spectral conversion device 100 may be a unique structure which improves the effective photostability by up to or exceeding two orders of magnitude when used in bright white solid state lighting sources, while potentially still achieving 90% range spectrum conversion quantum yields provided by organic luminophors. Moreover, the spectral conversion device 100 may not exhibit the 30%-50% light scattering waste of inorganic phosphor powders in transparent matrices, resulting in approximately 30-60% light output improvement for this innovation. The spectral conversion device 100 may also be referred to as a Collimating Photon Converter, or CPC.

Light sources 20, such as LEDs may include blue-light, UV light, or any electromagnetic radiation wavelength that in combination with the chosen organic photoluminescent materials associated with a matrix may result in a desired output spectra. For instance, organic photoluminescent materials typically have been used as thin films and at low dye concentrations, for example, ≤0.2% in Polymethyl methacrylate (PMMA) which permitted a sufficient amount of input light 21 to pass and create white light LEDs with very high initial performance. However, the dyes in a matrix may become increasingly transparent to the transmitted input light 21 over time. In some instances, after only 500-1000 hours of use at a high radiant flux of ~425 mW at 465 nm, a 0.02 wt % concentration, a 5 micron thick BASF perylene orange emitter in polymethyl methacrylate (PMMA) may exhibit a ~5% increase in transmitted input light 21 coupled with a matched reduction of the emission spectrum.

However, the lifetime of an embodiment of a photoluminescent color converter matrix 40 based on >1000 times the total amount of photoluminescent dye may potentially result in well over 100,000 hours. Additionally, an approximately 5% change in the emitted light spectrum may occur using the same organic photoluminescent material in the photoluminescent color converter matrix 40. Thus, an increase to a 2.0 wt % concentration, 20 micron thick perylene orange emitter in PMMA may provide a substantial margin for error, and may allow one having skill in the art to achieve results comparable with a 15 year lamp life (~132,000 hours continuous or ~50,000 hours on a typical dawn-to-dusk nominal use basis). Other color dyes in this class along with a few other dye types have long life characteristics for practical dye concentrations to be used. This method may require a second color converter device structure to provide the desired output light spectrum, if the chosen input spectrum does not match the excitation spectrum for the chosen dye.

Figure 2A:
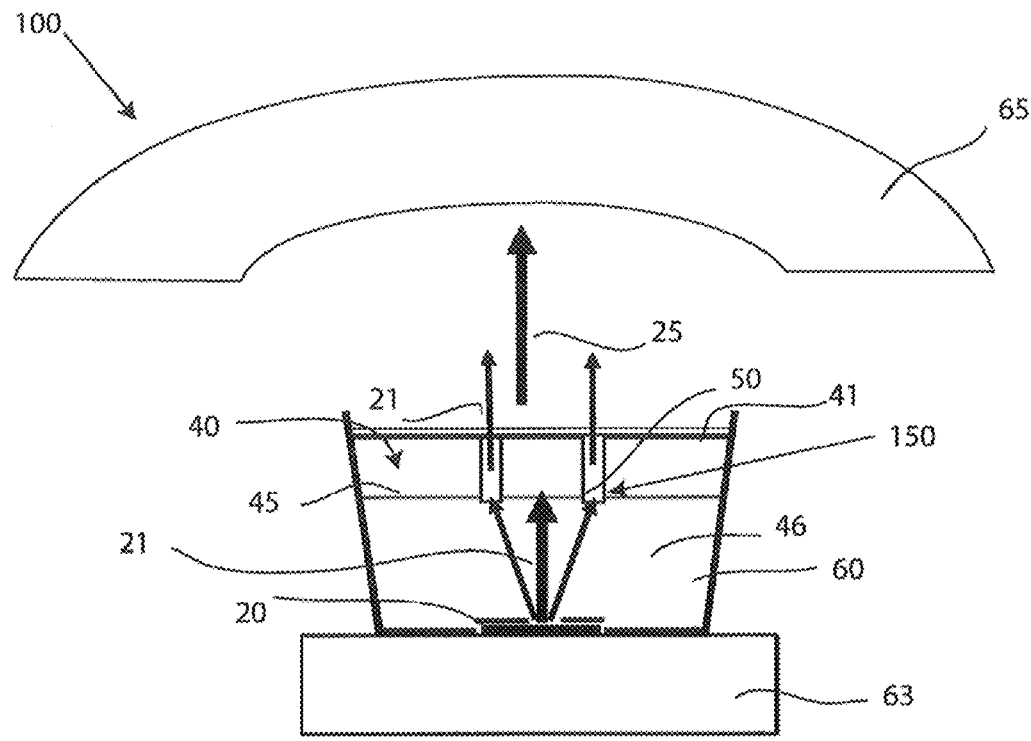
FIG. 2A depicts a schematic, cross-sectional view of an embodiment of a photoluminescent color converter matrix having positioned in an embodiment of a LED lamp.

Referring now to FIG. 2A, an embodiment of a spectral conversion device 100 operably associated with a LED lamp may include a photoluminescent color converter matrix 40, a blue light source 20, a base 60, a cover 65, a reflective filter 67, and a reflector base 63. The spectral conversion device 100 may also include plurality of discrete units 50, the plurality of discrete units 50 including transparent discrete units 55 and dyed discrete units 51, wherein the dyed discrete units 51 are dyed with a photoluminescent material at a concentration greater than or equal to an amount sufficient to absorb and convert substantially all input light from a light source 20 to a desired output spectrum 25, and a coating material disposed around the plurality of discrete units 50, wherein the coating material binds the plurality of discrete units 50 to form a matrix 40, further wherein a thickness of the coating material determines the distance between each of the plurality of discrete units 50, wherein when the plurality of discrete units 50 are positioned over, proximate, or otherwise near the light source 20, the input light 21 passing through the transparent discrete units 55 is not converted, and the input light 21 passing through the doped discrete units 51 is converted to red and green wavelengths 25, further wherein the emitted input light 21 and the converted red and green light 25 correspond to the desired output spectrum 25 to produce one or more colors.

Figure 3:
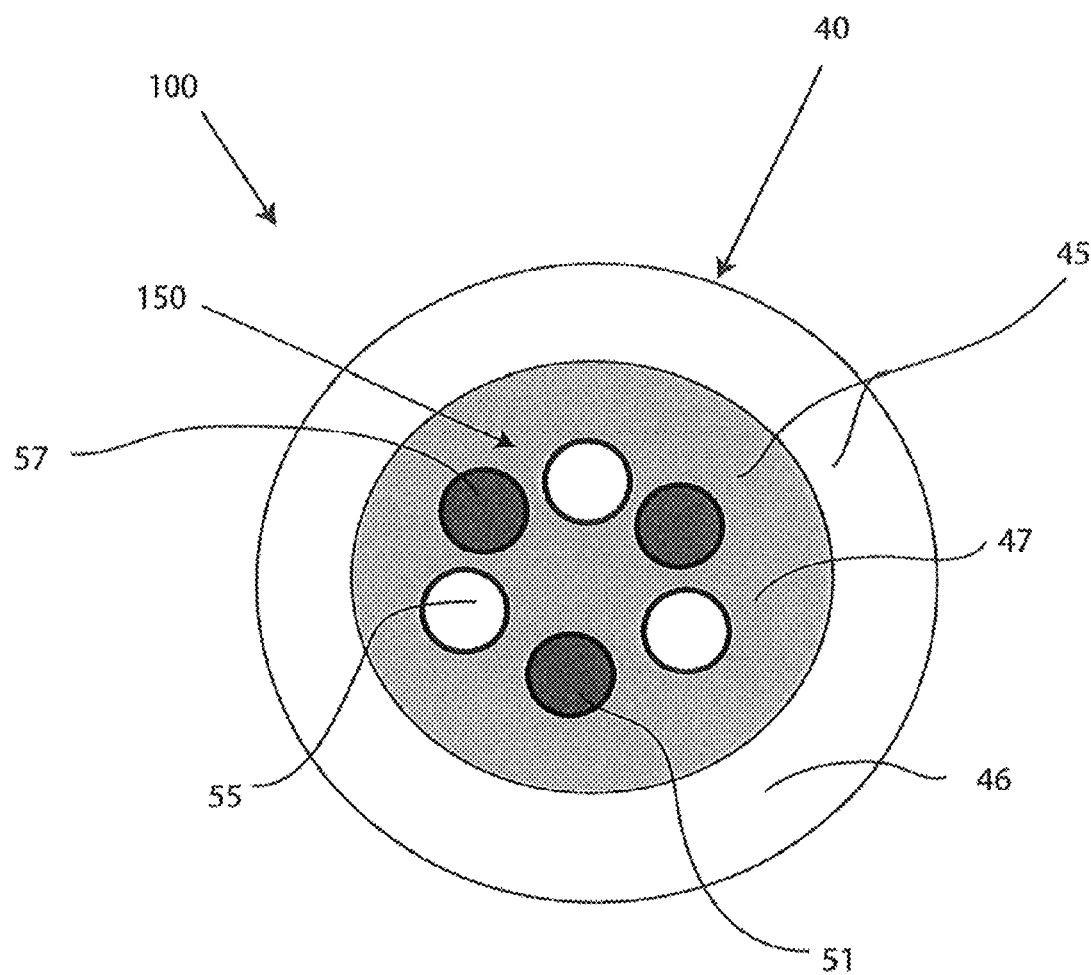
FIG. 3 depicts a top view of an embodiment of a photoluminescent color converter matrix.

The photoluminescent color converter matrix 40 of embodiments of a spectral conversion device 100 may be formed by a plurality of discrete units 50 and binder material 45. The photoluminescent color converter matrix 40 may not include a separate binder material 45, for example, the coatings on the discrete units 50 may be the binder material 45. The photoluminescent color converter matrix 40 may be a polymer matrix, a matrix, a substrate, a surface, a polymeric composition, and the like. The binder material 45 which helps form the photoluminescent color converter matrix 40 may be a clear material such as PMMA or polyestrene, and may also be referred to as a clear base 46. Moreover, the binder material 45 which helps form the photoluminescent color converter matrix 40 may be doped to achieve a certain color, for example, PMMA may be doped with an orange or yellow dye to form a doped base 47 (as shown in FIG. 3). In some embodiments, the binder material 45 contributing to the photoluminescent color converter matrix 40 may include both a clear base 46 and a doped base 46, wherein the clear base 46 is disposed generally around the doped base 47, within the doped base 47, or otherwise near the doped base 47. In yet another embodiment, the clear base 46 may be positioned below the plurality of discrete units 50, wherein the discrete units 50 are held together by the coating material.

Furthermore, the photoluminescent color converter matrix 40, having a clear base 46 and/or a doped base 47, may encompass a plurality of discrete units 50 to precisely pass a predetermined portion, or percentage, of input light 21 from the light source 20, while also converting another portion, or percentage, of input light 21 to converted blue light 25 having longer wavelengths. In most embodiments, the converted blue light 25 may be converted into green-to-red wavelengths. Additionally, input light 21 passing through transparent discrete units 55 positioned somewhere in the photoluminescent color converter matrix 40 is not converted to other wavelengths. Thus, the amount of input light 21, such as blue light, passing through the photoluminescent color converter matrix 40 may be controlled by varying the number of transparent discrete units 55 located in the photoluminescent color converter matrix 40. A light source 20 emitting light, such as blue light, UV light, or any electromagnetic radiation may be positioned a distance from the photoluminescent color converter matrix 40. In one embodiment, the light source 20 may be a LED emitting blue light or UV light positioned beneath, proximate, or otherwise near the photoluminescent color converter matrix 40. Additionally, a reflective film 62 may be placed proximate or otherwise near the light source 20 with an opening for the light to pass through.

Figure 2B:
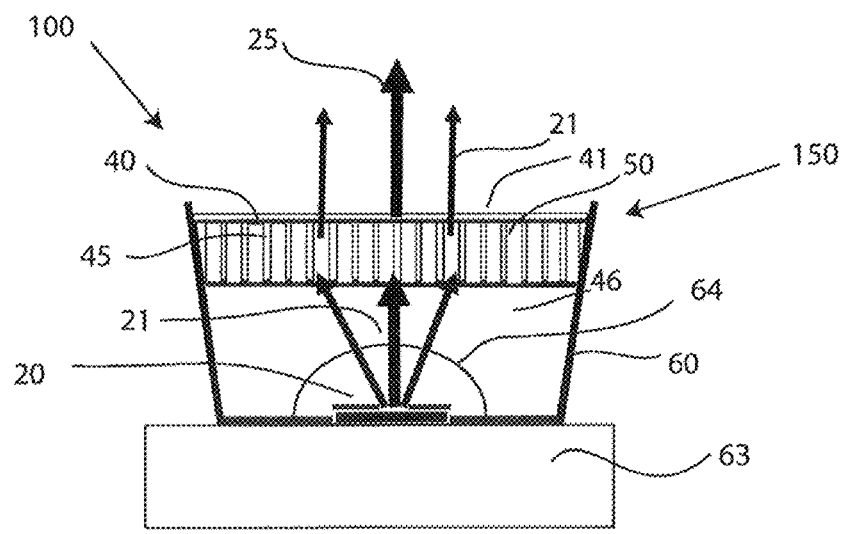
FIG. 2B depicts a schematic, cross-sectional view of an embodiment of a photoluminescent color converter matrix having more than two discrete units positioned in an embodiment of a LED lamp.

With continued reference to FIG. 2A, and now with additional reference to FIG. 2B, the spectral conversion device 100 may be used in association with LED lighting. The spectral conversion device 100 may accommodate organic photoluminescent material photo-degradation effects without a significant shift in the output spectrum over very long term and high intensity light exposure conditions. Sufficient organic photoluminescent dye may be used in (with) the discrete units 50, or organic spectrum converter paths, to provide over 100× life extension when compared to conventional photoluminescent conversion structures, while still providing very high quantum yields. Most of the organic photoluminescent dyes may exhibit little light absorption by the photo-degraded dye molecules, especially in low concentration photoluminescent color converter matrices 40. The photoluminescent color converter matrix 40 containing the dye, and/or dyed discrete units 51, may become increasingly transparent to the input light 21 with exposure to light at the photoluminescent excitation wavelengths. Dyed discrete units 51 may include red discrete units 57 and green discrete units 59, but may also include orange discrete units 58 and yellow dyed discrete units 56. Although blue light becoming increasingly transparent has usually been viewed as a lifetime problem, this characteristic can also provide a path for extending the life of organic photoluminescent materials. For example, yellow, orange and red perylene based luminophors have been identified that they exhibit high stability and desirable properties at lower concentrations. Other colors of organic photoluminescent materials and organic materials may be used in to optimize the desired photoluminescent characteristics. Thus, the spectral conversion device 100 in association with LED lighting may not only introduce organic photoluminescent materials to replace, supplant, substitute, etc. inorganic phosphors, but they may also vary the concentration of a dopant or dye and vary the thickness 34 of the photoluminescent color converter matrix 40, or diameter/thickness of a discrete unit 50 to increase the lifetime and efficiency of white LED lighting.

Previous adaptations of the inorganic phosphor approach where the dye concentration and thickness of an organic photoluminescent material converts just enough blue light into other colors while passing the right amount of blue light may not be adequate when there is a significant photo-degradation effect. As the organic photoluminescent material of the photoluminescent color converter matrix 40 and/or plurality of discrete units 50 degrades, input light 21 is increasingly passed and less color may be shifted; however, light may be emitted, significantly changing the color balance with time. To help avoid the negative effects of photo-degradation, a suitable organic photoluminescent material, discussed infra, used in association with the spectral conversion device 100 may be selected. Furthermore, the surface 41 of the photoluminescent color converter matrix 40 may have many different shapes to optimize light collection, for example, a flat surface, arcuate/curved surface, convex surface, and the like. Varying the coating of the discrete units 50 and index of refraction may also affect light collection.

Selecting a suitable organic photoluminescent material for the photoluminescent color converter matrix 40 and/or the discrete units 50 to help avoid photodegredation of the photoluminescent material and overall operable configuration of the spectral conversion device 100 may involve the following parameters:

1) The selected organic photoluminescent material (e.g. dye or dopant) in a photoluminescent color converter matrix 40, in particular, in the discrete unit 50, may have a sufficient dye concentration and thickness or diameter combination to absorb all or substantially all the incident input light 21 or UV light throughout the expected lifetime of the product (thermal and chemical stability of the matrix may be sufficient for broad applicability commercial use). Absorbing and/or converting substantially all input light 21 may include 95% to 100% of input light 21. In alternative embodiments, the percentage of abrobed and/or converted light may be below 95% depending on the desired output spectrum 25;

2) The selected organic photoluminescent material (e.g., mixed in polymer matrix or dyes only) may have high transmission to its own emission wavelengths, a high quantum yield, and good absorption for the input light 21 wavelengths of a LED. There may be little, if any, overlap between the absorption and emission spectra in an ideal organic photoluminescent material. For example, a larger Stokes shift may be desired. An absorption and emission overlap may reduce efficiency and narrow the output spectrum in the spectral conversion device 100, but this may be compensated for with additional dyed discrete units 51, or color conversion light pathways, and additional color dyes;

3) The organic photoluminescent material may lose almost all light absorbance as it photodegrades;

4) The organic photoluminescent material may have sufficient solubility in practical solvents and acceptable matrix materials;

5) The multiple color converter photoluminescent materials in small structures may be achieved in a similar way as the transparent discrete units 55. Thus, multiple materials may be used to fill out almost any desired output light spectrum;

6) The plurality of discrete units 50 or other structures inserted into the photoluminescent color converter matrix 40 may be sufficient in type and quantity so as to not create optical effects as desired. In addition, use of the index of refraction material as the matrix and attention to the various surfaces may be important (lower index of refraction ($\eta$) in the fill than the discrete units 50 to trap light in the discrete units 50, a higher $\eta$ fill to trap light in the photoluminescent color converter matrix 40, and the same $\eta$ for the fill and discrete units 50 to minimize wavelength versus position effects away from the output of the organic spectral conversion device 100;

7) The shape of the spectral conversion device 100 and components included or associated with the spectral conversion device 100 may be formed to optimize light cone angles for various applications, in conjunction with other structures or lenses;

8) The overall photoluminescent color converter matrix 40 structure may vary and may also adopt design approaches known to those having skill in the art for minimizing light trapping 1091;

9) The sides of the discrete units 50 may be coated to minimize sideways light loss or interference when multiple color converter materials are used. An exemplary embodiment of the spectral conversion device 100 uses a lower index of refraction ($\eta$) coating than the discrete units 50 (e.g., 100 nm Sputtered silicon nitride, PFEA) followed by an optional second blocking reflective coated surface (e.g., 100 nm sputtered aluminum+1% copper) for the white and multi-color converter. For instance, light may be channeled forward to minimize light leakage laterally to other discrete units 50. However, reflective fill, high or low $\eta$ coated, and uncoated discrete units 50 may be acceptable in some embodiments. Coatings can be inorganic or organic as desired and be applied by any methods that provide the desired result (e.g., sputtering, evaporation, chemical vapor disposition (CVD) and all suitable types of CVD, including plasma-enhanced CVD, spray, immersion, brushing, etc.). A second blocking-reflector layer may also be applied to the discrete units 50, but may be optional for transparent discrete units 55. However, a low index of refraction (η) layer may be suitable for a transparent discrete unit 55 in the spectral conversion device 100; and 10) The non-photoluminescent dyes such as those sometimes used in transparent colored plastics may also be added in this device 100 to narrow portions of the light spectrum, at the expense of energy efficiency.

Figure 13A:
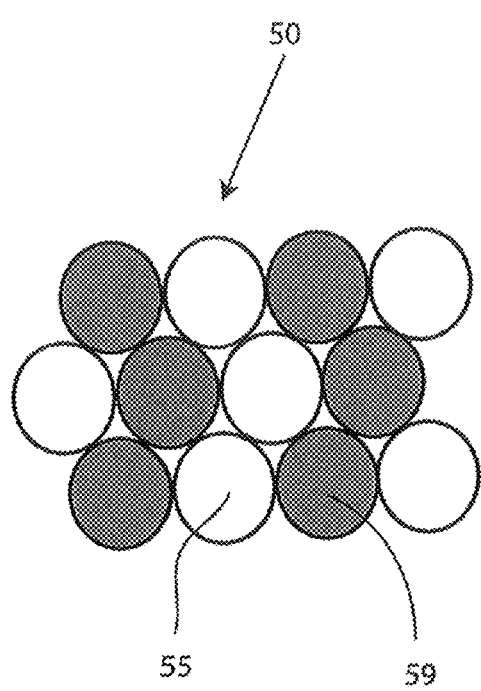
FIG. 13A depicts a top view of an embodiment of a discrete unit matrix, wherein the discrete units include laser rods of one color and transparent units.
Figure 13B:
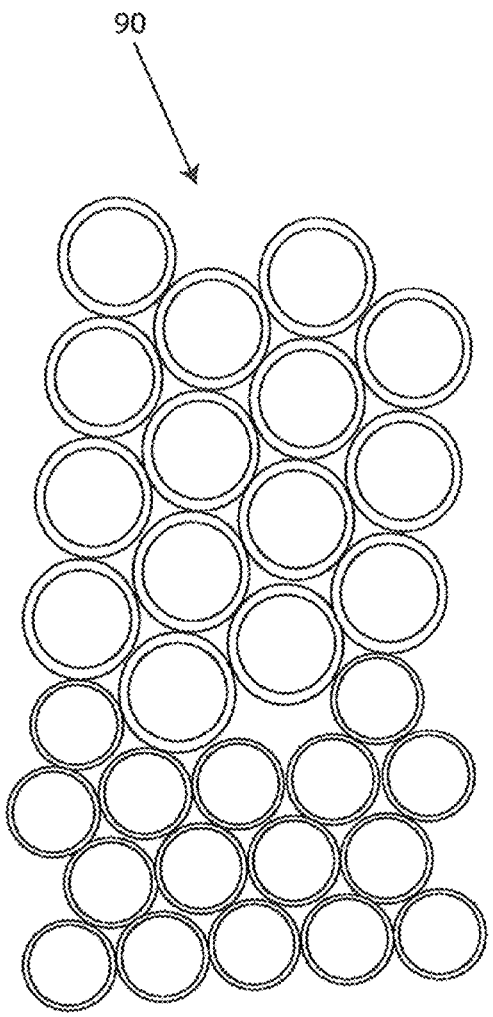
FIG. 13B depicts a top view of an embodiment of a discrete unit matrix.

An additional embodiment of the spectral conversion device 100 may be formed using a unique and different method than "photonic crystal" technology for LEDs. For example, the energy may be either absorbed and converted using organic photoluminescent materials to other colors in the discrete units 50, or channeled through simple optical fibers. Furthermore, the density, spacing, and diameter of the fibers, such as discrete units 50, may be made single-mode and even evanescent using discrete units 50 at submicron or nanostructure diameters. The discrete units 50 can be arranged closely together to create an effective photonic crystal lattice effect or grating effect. Thicker coatings can be used to hold the discrete units 50 apart a specific distance to achieve a specific photonic lattice pattern or grating effect. Such photonic lattice pattern effects and designs may uniquely be applied to the different embodiments of the spectral conversion device 100 for additional spectrum control from the combination of the spectral conversion device 100 with photonic arrangement. Thus, an additional embodiment of the spectral conversion device 100 may include the organization of discrete units 50 or fibers with interiors and coatings of thicknesses to create a self structured lattice 90, as shown in FIG. 13B. This photonic lattice arrangement effect 90 may also be achieved in grown fibers by patterning the seed layers or by forming a self-aligned seed layer matrix at dimensions that are below-the-wavelength of the light to be used in the respective part of the array. The same is true for a plurality of discrete units 50, such as bundled nanofibers or ribbons using the coatings as spacers. Such an arrangement 90 may be used to further narrow or expand the spectrum of emitted light. A uniform size and pitch and materials design of the photonic lattice arrangement (fiber or ribbon size, coatings or cylinders, and spacings or fills) can be used to tighten the output spectrum or modify light directionality, while a variable unit size and spacing arrangement can broaden the output spectrum. In most embodiments, one, two, or more coatings may be used on the discrete units 50 that make up the photoluminescent color converter matrix 40 of the spectral conversion device 100.

The height and/or base of various portions and/or components of the spectral conversion device 100, including the photoluminescent color converter matrix 40, may vary to modify coherence, color, and polarity. This novel technique may be used on a single discrete unit 50 bases within the photon converting enabling light wave interactions, on a quantum scale, or as larger collective sections of the spectral conversion device 100 for larger area effects. Multiple length columns or ribbons can be made simultaneously. One technique for making such structures is to fabricate, place, or grow the units on a stepped height substrate. Fiber or ribbon extensions above or below the active part of the laser(s) or non-laser spectral conversion devices 100 can be used. Furthermore, coherence and incoherence can potentially be achieved using this approach, as well as longitudinal destructive interference of light. One method to achieve destructive interference of light involves sub-200 nm fiber or ribbons, such as discrete units 50, packed so the gap between the light columns is filled with highly overlapped light from neighboring offset height fibers in the fill or coating medium (height difference adjusted for coating(s) or fill index of refraction effects on light velocity so as to achieve the desired interference effect(s)). Multiple layer coatings on units (including fibers and ribbons) may also be used to restrict, scatter, transmit, convert light spectra, or to enhance light wave interactions with matter, electric or magnetic fields, with various coherence, phase, and polarity light waves, and other control factors. Arrangements and shapes of Units (e.g., fibers and/or ribbons), photonic lattice arrangements, and/or birefringence of units and coatings or fills, can be used to shift polarization and coherence to output light. Moreover, spectral conversion device 100 can include an array of ribbons with or without the photoluminescent material that are grown from random, self-organized, or patterned seed patterns using charged and/or polar molecules during the growth process to minimize sideways growth and where the light is introduced into alternating sections to induce large scale evanescent wave light interactions, wherein characteristics of the large scale evanescent wave light interaction are modified with changeable electrical, magnetic fields, or light switches through direct interactions or indirectly through interaction with various coatings.

The addition of electrodes on either side of arrays, or at multiple points in the array can be used to provide electric field induced effects on the arrays or units. Various dielectric, dipole materials, ionic, trapped charge, molecular charges, or conductive coatings may be used in or as unit coatings, or fill materials to cause electric field bias effects or modulation. These effects can be induced at a single unit level or as collective parts of the photoluminescent color converter matrix 40, or the entire photoluminescent color converter matrix 40 as desired. Similar control exists for the use of magnetic fields for biasing, light control, and/or modulation if magnetic dipoles, magnetic materials are used. Either or both electric or magnetic fields may be used to modify or control wavelength, polarization, coherence, amplitudes, and other effects in photoluminescent color converter matrices 40. Placing fibers or ribbons between light transfer ribbons can be used to adjust polarization and/or coherence at pitch dimensions under half the wavelength of the light being modified with the properly designed systems birefringence, dimensions, and input wavelength, coherence, and polarization combinations. Using a photoluminescent color converter matrix 40-LED approach, a precise white balance may be established and almost no change may occur in the converted light spectrum until the entire dye matrix is degraded. The spectrum of the lamp may be set by the LED, dye choices, and relative area of the discrete units 50 to the converters.

Referring again to the drawings, FIG. 2B depicts an embodiment of spectral conversion device 100 being used to convert input light 21 into longer wavelengths, such as green-to-red conversion (converted blue light 25). The photoluminescent color converter matrix 40 may include transparent discrete units 55 inserted therein, and may include a binding material to form the photoluminescent color converter matrix 40, or the coating material on the discrete units 50 may act as the binding material/agent. The matrix 40 may only include transparent discrete units 55. A plurality of discrete units, such as transparent discrete units 55 and dyed discrete units 51 may be formed of various colors and properties different spectra and radiating patterns. Moreover, the plurality of discrete units 50 may be assembled into a closely packed photoluminescent color converter matrix 40. Coatings on the fibers, such as discrete units 50, may act as the binder material 45, and may be clear or dyed. Alternatively, the binder material 45 may include a clear base 46 and/or a doped base 47 to bind the discrete units 50 to form the photoluminescent color converter matrix 40. Furthermore, a input light 21 or UV light 22 LED may have an optional lower index of refraction bubble formation lens 64 to refract more light upward (e.g. air or fluoropolymer).

Figure 2C:
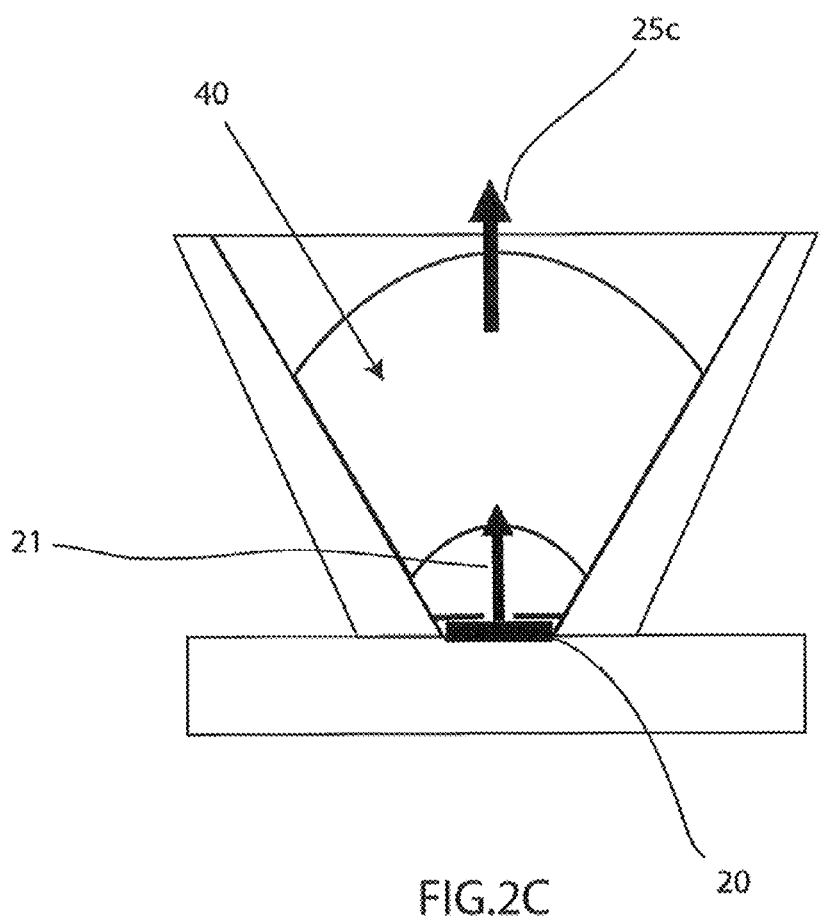
FIG. 2C depicts a schematic, cross-sectional view of a an embodiment of a photoluminescent color converter matrix dried or molded into a cup, or preformed and placed over the LED with an optional adhesive.

With continued reference to the drawings, FIG. 2C depicts an embodiment of a spectral conversion device 100 which may convert input light 21 into the red output spectrum 25c. For instance, mixed concentrations and dyes may be used to narrow the spectra. The polymer photoluminescent color converter matrix 40 may be dried or molded into a cup-like formation, or preformed into a desired formation and placed over a light source 20. An adhesive may be used when placing over the light source 20. Moreover, an optional reflective filter 67 may be placed near the top of the light source 20 under the photoluminescent color converter matrix 40 to allow passage of incoming light and reflect back other wavelengths.

Figure 4:
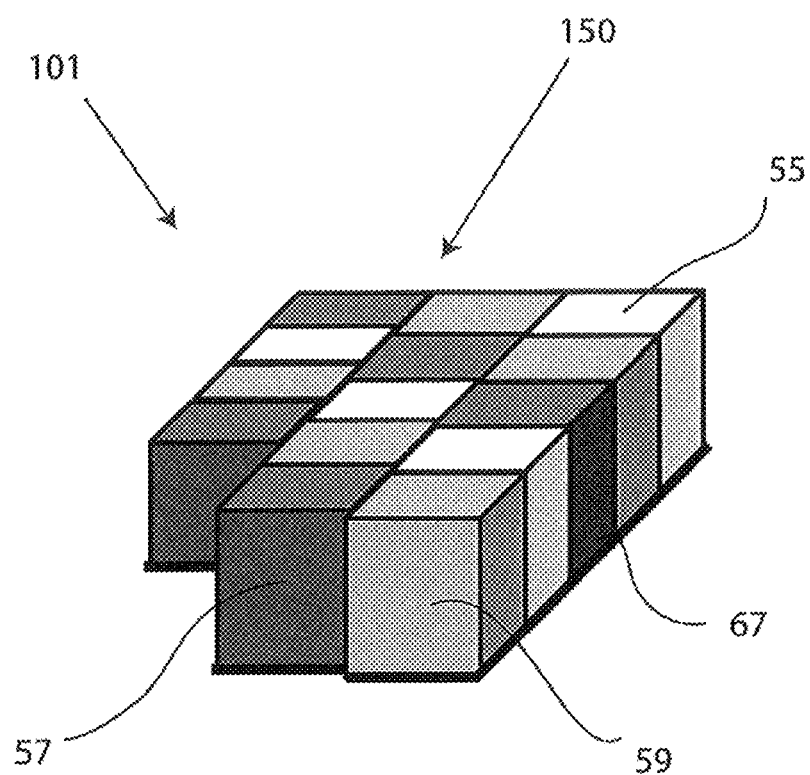
FIG. 4 depicts a perspective view of an embodiment of a discrete unit matrix, wherein discrete units are pellets or ribbons.

FIG. 4 depicts an embodiment of a spectral conversion device 100, which may contain a plurality of discrete units 50. A discrete unit 50 can be an individual element which interacts with electromagnetic radiation. For example, a discrete unit 50 may absorb light, convert light, transmit light, communicate light, channel light, may be transparent and/or translucent and allow light to pass through, and the like. Moreover, a discrete unit may be a polymeric material having varying dimensions suitable for optical applications. A discrete unit 50 may rigid, flexible, or semi-rigid, depending on the application. Furthermore, a discrete unit 50 may be an optical fiber, fiber, tapered fiber, ribbon, cured ribbon, a cylinder, a pellet, and the like. The plurality of discrete units 50 may form a substrate, such as the photoluminescent color converter matrix 40, placed over a light source 20, emitting blue light or other electromagnetic radiation. Those skilled in the art should appreciate that the blue light as the input light 21 may include the visible short end of the visible spectrum in violet-blue, blue, or violet light; the precise input light 21 can be an engineering design selection matter.

The photoluminescent color converter matrix 40 may be fabricated in various ways. In one embodiment, the photoluminescent color converter matrix 40 is fabricated using a 1 mm thick film of the BASF® Lumogen F blue, yellow, green, orange, or red perylene dyes at approximately 2% weight concentration in a PMMA base with long transparent discrete units 55 of coated PMMA imbedded in the matrix 40; each discrete unit 50 may have approximately a 0.25 mm diameter and 1.25 mm length. The percent weight concentrations may vary, and in most embodiments range from 0.02% to 100% weight concentration. The thickness 34 and length 35 of the discrete units 50 may also increase or decrease. The discrete units 50 may be polymer fibers or pellets coated with typical fiber optic coatings, especially if the fiber length 35 is long. Coating the matrix materials may also be used to reduce solubility in a solvent used in the matrix 40 or to reduce dye mixing at the perimeter of the fiber or pellet used as a discrete unit 50. The coatings on the discrete units 50 may be inorganic material or organic material. Furthermore, hybrid organic-inorganic materials may also be acceptable for units or fill such as 1% zinc acetate in PMMA or polystyrene when the spectral conversion device 100 is being driven by >420 nm blue LED source. In many embodiments, the outside of the materials are coated with coating material, such as by fluorinated plasma. In addition, the dyes used in association with the photoluminescent color converter matrix 40 may be an organic dye. Possible organic dyes include, but are not limited to, varieties of perylenes, squarines, polyfluorines, and high quantum yield fluorescent materials with reasonable life that may absorb and emit in the proper wavelength ranges.

Fabrication of the photoluminescent color converter matrix 40 may further include a solvent containing a polymer such as PMMA, precursors to a polymer, or other suitable material to bond the discrete units 50 to form the photoluminescent color converter matrix 40, or similar substrate. For example, greater than or equal to 0.02% weight concentrations of BASF® Lumogen F Orange 240 dye to PMMA in methyl methacrylate, toluene, acetone, and the like may be used. In some embodiments, undyed PMMA may also be prepared for the base coating for glass slides with a target thickness of approximately 0.25 mm, but the discrete unit 50 diameter and dye type can be almost any size that provides the output light spectrum desired. Possible solvents which may be used include water, several alcohols, and most organic solvents. In an alternative embodiment, the photoluminescent color converter matrix 40 may be formed without requiring a solvent by melting, molding, or pressure. Transparent undyed PMMA fibers (coated fibers like typically used for fiber optic applications) e.g., ~0.25 mm in diameter may be cut to ~2 mm long segments. These segments may be placed upright in the clear PMMA base coat while it is still tacky. Almost any transparent medium may work, including Acrylic (PMMA), polystyrene, polycarbonate, diglycol carbonate, polyurethane (e.g., SIM 1802, SIM 2003), polyvinyl alcohol, and other transparent materials such as tetraethylorthosilicate, etc. The number of discrete units 50, or fibers, per test structure may be estimated for a reasonable white balance during the early part of the project, after the initial intensity and spectral measurements for an exemplary 2% dye in PMMA parameters. The discrete units and film may then be baked at 80 degrees C. for 60 minutes. PMMA containing, for example, 2% perylene dye may then be flowed around the discrete units 50 to the thickness 34 of the discrete units 50. The photoluminescent color converter matrix 40 will then be baked at 80 degrees Celsius for 60 minutes. The device may be powered with a high brightness 450-470 nm center wavelength range LED.

Another possible fabrication method of the photoluminescent color converter matrix 40 may include placing a plurality of discrete units 50 in a variety of different ways with different coating thicknesses and unit-to-unit spacings. For example, discrete units 50 may be made into a "carpet" and imbedded into a base that may be filled with the matrix material and cut, separated, or shaped for mass production assembly. In another embodiment, pieces of the dyed polymer base, or doped base 47, may be formed as small blocks or cubes of the clear polymer, or clear base 46. Other shapes may also be possible, but a vertical shape relative to the direction of the light may provide smaller colored light sources 20 at the surface of the spectral conversion device 100 which may be less visible. Optically coated materials help to minimize light scattering and to efficiently channel light in the discrete units 50; however, it may work with balls, wedges, or other geometrical shapes. Most of the coating material may be dissolved or polished off after assembly.

In most embodiments, coating material placed on or applied to the plurality of discrete units 50 may be used to control spacing between the units 50. These coatings would usually be a lower index of refraction ($\eta$) than the discrete units 50 themselves or any dyed or transparent fill materials. For example, if the discrete units 50 and/or the binder material 45 contained PMMA or polystyrene, then polytetraflouroethylene (PTFE) or Polyvinyl butyral may be suitable coating material. In other words, the coating thickness may provide a standoff between discrete units 50 and allow bundles of uniformly spaced discrete units 50 to easily be constructed. The coatings may also be optionally dyed in a similar high concentration manner as the discrete units 50 or and the fill materials. In another embodiment, additional colors may be made and imbedded in the photoluminescent color converter matrix 40. In yet another embodiment, large or small numbers of discrete units 50 (fibers or pellets) in bundles may be molded or bound together and sliced to form more complex combinations of spectra. Such slices in the case of a fiber optic bundle may be cut or molded for optimized optical shapes.

Figure 5A:
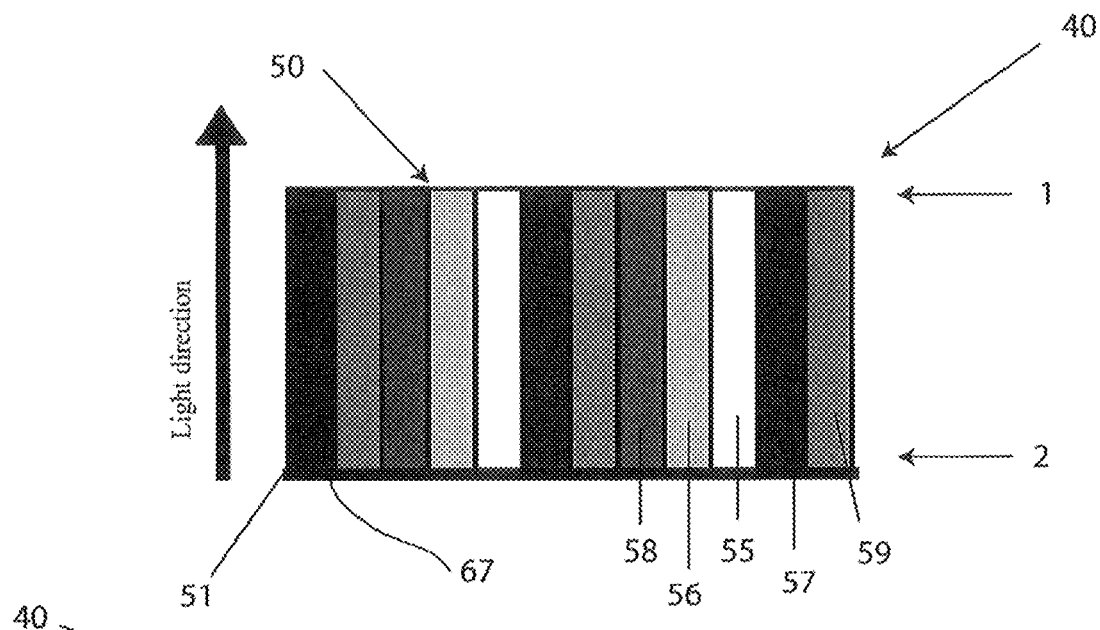
FIG. 5A depicts a cross-section view of an embodiment of a discrete unit matrix.
Figure 5B:
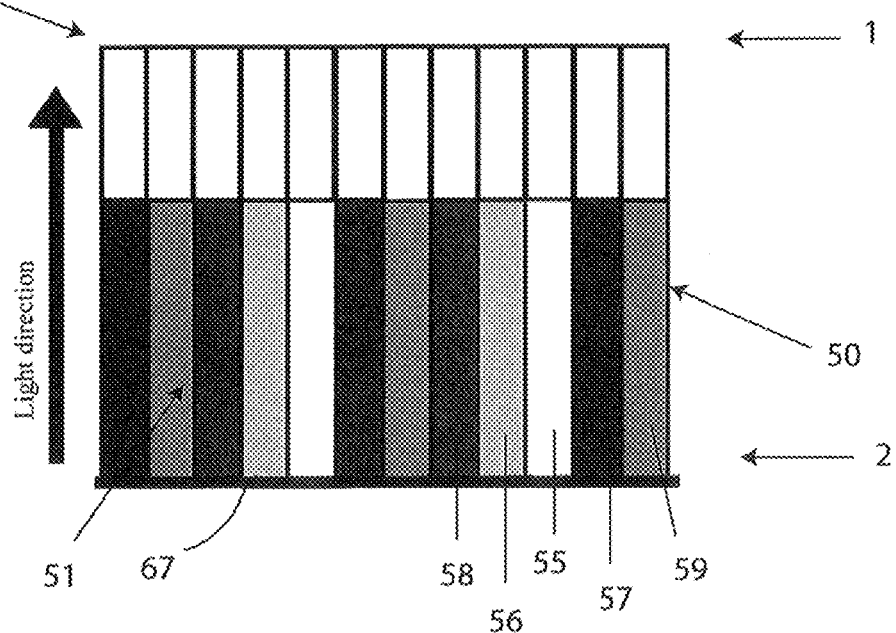
FIG. 5B depicts a cross-sectional view of an embodiment of a discrete unit matrix with transparent tops.
Figure 6A:
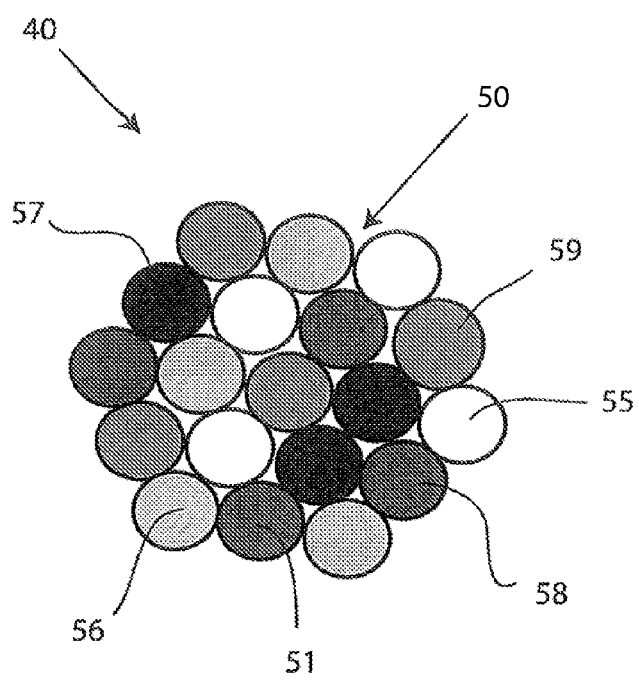
FIG. 6A depicts a top view of a first embodiment of a discrete unit matrix.
Figure 6B:
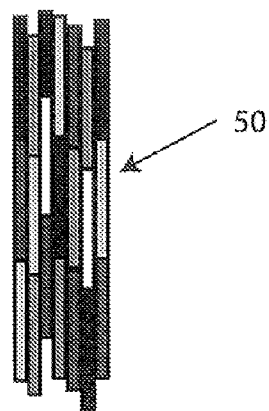
FIG. 6B depicts a top view of a second embodiment of a discrete unit matrix.

Referring still to the drawings, FIGS. 5A-5E depict a cross section of an embodiment of a plurality of discrete units 50 forming a photoluminescent color converter matrix 40, wherein the binder material 45 is the coating material on the discrete units 50. In addition, FIGS. 6A and 6B depicts top views of a first and second embodiment of a plurality of discrete units 50, such as fibers, forming a photoluminescent color converter matrix 40, or a substrate. The plurality of discrete units 50 may also be referred to as a bundle of fibers. A bundle of fibers may hold a large number of fibers of as many colors of dyes in the various different fibers as desired. The plurality of discrete units 50, or bundle of fibers, may intentionally include clear material fiber, such as transparent discrete units 55, among the doped fibers, such as dyed discrete units 51. The discrete units 50 may have an upper portion 1 proximate the end of the discrete unit emitting the desired output spectrum 25. Additionally, the discrete units 50 may have a lower portion 2 proximate the end of the discrete unit 50 which accept the input light 21 emitted from the light source 20.

Moreover, the input light 21 may be directed through transparent paths, such as transparent discrete units 55, for the desired white balance ratio (e.g., fibers or other small structures). To minimize color change with position, a refractive index material may be used for each color path, such as red and green discrete units 57, 59 and the transparent discrete unit 55.

Figures 7A, 7B:
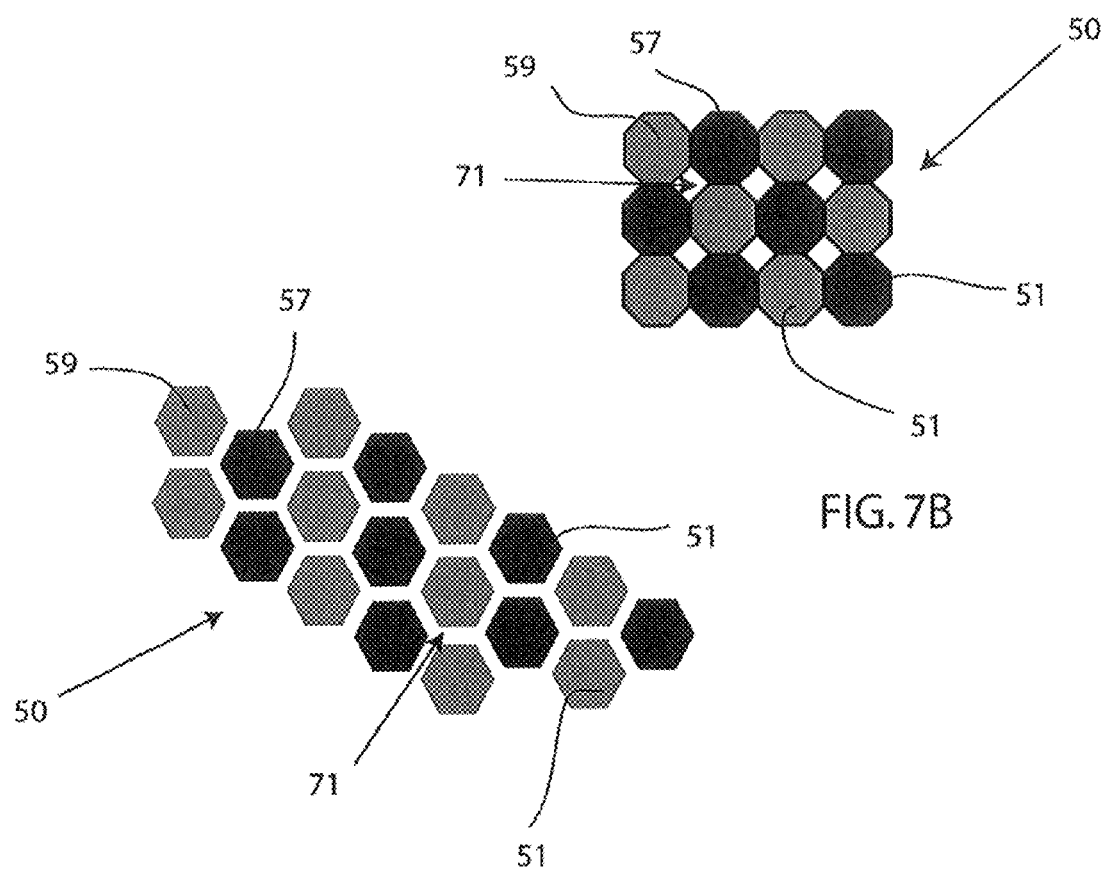
FIG. 7A depicts a top view of a first embodiment of a discrete unit matrix, wherein the discrete units are spaced apart from each other by a material.
FIG. 7B depicts a top view of a second embodiment of a discrete unit matrix, wherein the discrete units are spaced apart from each other by a material.

With additional reference to FIGS. 7A and 7B, gaps 71 in the plurality of discrete units 50 may be created by varying the shapes of the discrete units 50, and may also be intentionally filled with clear material or another color to form transparent discrete units 55 and dyed discrete units 51, respectively. In one embodiment, large bundles of fibers may be combined, sliced to the desired thickness 34, and then may be cut into small sections to be placed over a light source 20. In another embodiment, pellets may be mixed and adhered together to form sheets that may be cut into smaller pieces; the small pieces of color converter may be placed on tape (e.g. Mylar) and placed over a LED using high capacity automated equipment known to those having skill in the art. The tape may be left on or removed from the light source 20, depending on the device design and the materials being used.

Additionally, novel variations of the photoluminescent color converter matrix 40 may be obtained. In one embodiment, the clear material intentionally included among the plurality of discrete units 50 may also be doped with a blue dye which may shift the blue spectrum to a desired point to permit the use of Ultra Violet LEDs. In another embodiment, non-fluorescent dyes in similar type matrix materials as the photoluminescent dyes may be used to narrow the spectrum for narrower spectrum colors, but placement of absorbing-only dyes would be most optimally placed on the output side of photoluminescent color converter matrix 40 and not mixed with organic photoluminescent materials. The diameter of the fiber discrete units 50 may vary from a smaller diameter (e.g. 0.01 mm) to a larger diameter (e.g. 10 mm), depending on the desired application. In an additional embodiment, the tops of discrete units 50 may be clear for higher directional light emission, as shown in FIG. 5B. For instance, a first portion of the photoluminescent color converter matrix 40 may include transparent discrete units 55, and a second portion of the photoluminescent color converter matrix 40 may include dyed discrete units 51. The ends, tips, or distal portions of the discrete units 50 may be beveled at one end to further optimize light acceptance into the individual discrete units 50 when the incoming light is introduced at shallow angles, as shown in FIG. 5C. Additionally, the spectral conversion device 100 may employ the use of a reflective filter 67, such as a dichroic filter, that may pass the incoming light but reflect over wavelengths back into the discrete units 50 to permit shallower angles to be used with or without the use of beveled ends 37 of discrete units 50. The discrete units 50 may contain a clear region or photobleached region near the top of the discrete unit 50 and below the active photoluminescent zone which may further improve efficiency as more light from the photoluminescence can be reflected back into the array.

Another exemplary embodiment of the photoluminescent color converter matrix 40 with respect to flat-panel display light source applications may be to form a mixture of low index of refraction ($\eta$) matrix coated red and green photo luminescent dyed discrete units 51, 59, each discrete unit 50 using optionally mixed dyes to narrow the output light spectrum, with the relative discrete unit diameters and spacer material thickness and optional fill binder matrix designed to provide the right balance the blue light coming from a blue LED. The discrete units 50 may be bundled, wherein the bundles are sliced into 1-3 mm thick pads and polished. The slices may be cut or otherwise divided into smaller groupings, optionally molding the smaller groupings using a heat press (e.g., into a reflective metal cup with an optional low index of refraction gap between the light source 20 and the photoluminescent color converter matrix 40 for optimizing upward light transfer when used with reflector 63.

In some embodiments of the spectral conversion device 100, the photoluminescent color converter matrix 40 may be molded or heat-pulled to form shapes that provide a desired light emission surface and light input surface for the pumping light source. For example, a heated shaped anvil(s) could be used to form conical or pyramid shapes that may be narrow at the base with a hyperbolic concave light entrance above a LED source, such as light source 20, and may be wider with a surface contour (flat, hyperbolic convex, spherical concave, etc. . . . ) The photoluminescent color converter matrix 40 may be pressed from a long array of multilayer coated discrete units 50, such as fibers, and cut into pieces as needed, and then re-molded a second time on any of the surfaces if desired. The shape of the photoluminescent color converter matrix 40 may be designed to best fit into the chosen backlight light guide.

Figure 8:
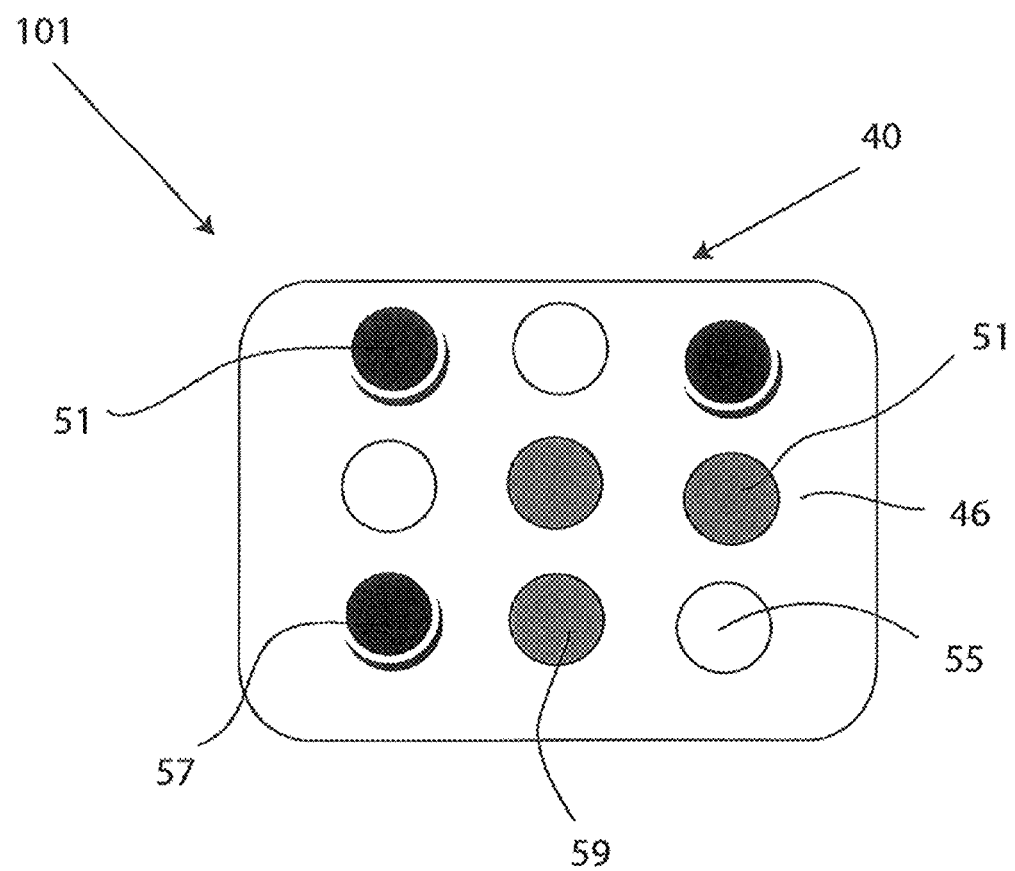
FIG. 8 depicts a top view of an embodiment of discrete units spaced apart from each other by a material.

Referring still to the drawings, with additional reference to FIG. 8, embodiments of a photoluminescent color converter matrix 40 may have discrete units 50 and/or binder material 45 having a dopant/dye concentration over 0.02% combined with a discrete unit thickness 34 greater than 0.1 mm in a transparent medium, such as a clear base 46 binder material 45; transparent discrete units 55 may also be included. Dyes may also be a dopant, a doping agent, a color conversion element, and the like. The discrete units 50 may be dyed, doped, combined, used, associated, etc. with a photoluminescent material, typically an organic photoluminescent material, but inorganic photoluminescent material may be used in some embodiments. In one embodiment, a photoluminescent color converter matrix 40 may not include any polymer medium or binder material 45, especially when utilizing 100% dye films. Furthermore, most photoluminescent dyes may have a maximum concentration level where they cease to stay in a solution, and may precipitate, causing light scattering. A dye concentration can be chosen up to, but below the point of precipitation or when other undesired dye interactions occur. Additionally, the high concentration dyes as single or multiple converters over multiple LEDs may be separated by a distance or placed close together, as depicted in FIG. 8. A large array of LEDs may be placed over an area with one or more photoluminescent color converter matrices 40 positioned on top of the individual or small groupings of LEDs. In many embodiments, each photoluminescent color converter matrix 40 may have a different dye concentration when positioned over different LEDs light sources 20. Different color LEDs may also be used with the photoluminescent color converter matrix 40 to optimize overall energy efficiency (e.g., a green or orange LED powering a red section of photoluminescent color converter matrix 40 would have a smaller stokes shift and higher overall efficiency). The use of very high efficiency color converters may permit color mixing to be done with one type LED, or a smaller mixture of LED types. It may also provide more color choices to create a more even balance white light. Infrared sources may also be added to a more sunlight-like source using UV LEDs. Moreover, the plurality of discrete units 50 act as organic dye lasers, wherein an input pumping light is used as a pulsed laser scanned by at least one input light source, further wherein the plurality of discrete units 50 are switched in secession so at least one discrete unit some units is in an on position. The plurality of discrete units 50, with or without the photoluminescent material, are arranged to amplify a spectrum shift and a shift of the polarization of light due to evanescent interactions of light in alternating portions of the one or more color conversion matrices.

Referring still to FIG. 8, an embodiment of spectral conversion device 101 having multiple LEDs (or multiple groupings of LEDs) placed on a surface with different color photoluminescent color converter matrices 40 completely over each blue light and/or UV 22 color range LED is depicted. The different color photoluminescent color converter matrices 40 may only include discrete units 50, such as red discrete units 57 and green discrete units 59. Spectral conversion device 101 may also include clear light transmission pathways, such as transparent discrete units 55. The number of colors may be added as needed in a mixture to create a target color spectrum. A mixture may also include color converter LEDs and different color LEDs. Different color LEDs may also be converted to adjust a spectrum or optimize energy efficiency. For example, a green LED may be used to transmit green, and some of the green LEDs could color converter to yellow, orange, red, or even near Infrared. It is possible that no light emission occurs between the LEDs, although from such surfaces reflection is usually encouraged. Multiple color LEDs of the same or different colors could be used if aligned to matched converters, or groups with the desired transparent and color converting units.

Figure 9:
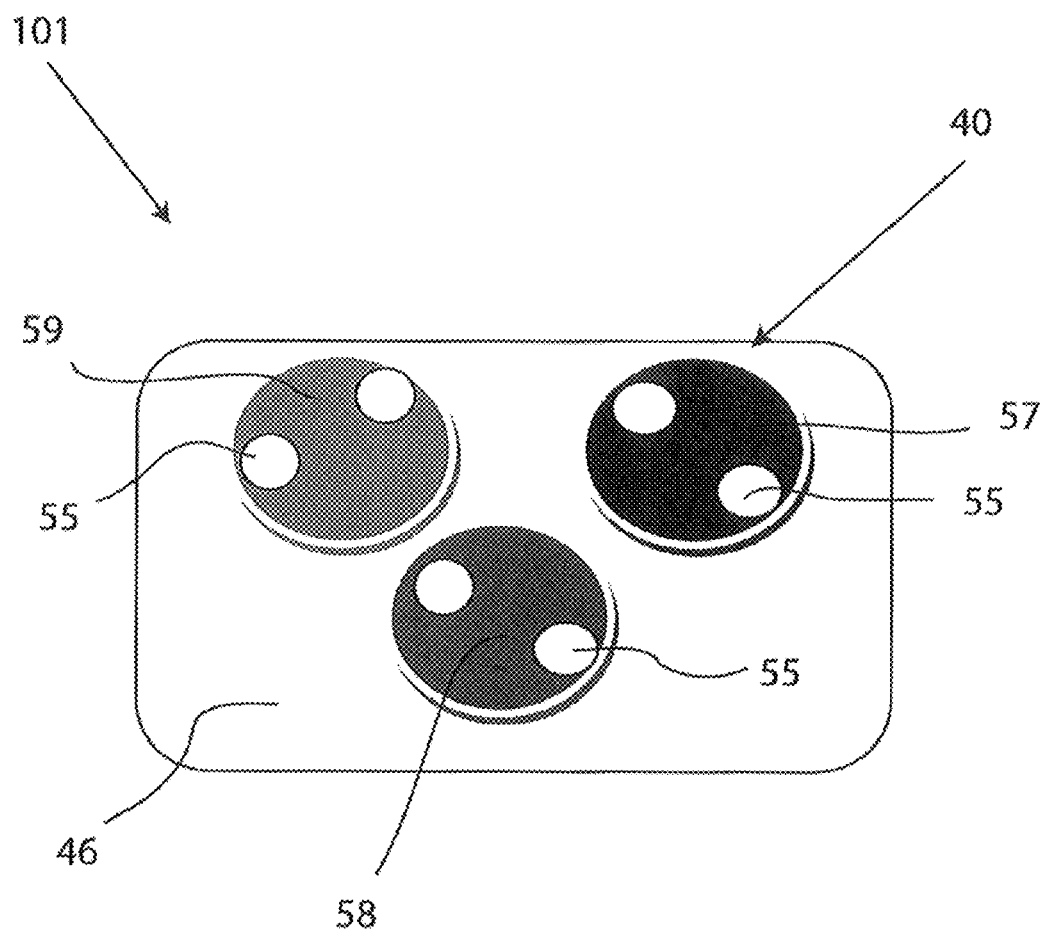
FIG. 9 depicts a top view of an embodiment of discrete units, wherein the discrete units include transparent units.

FIG. 9 depicts an embodiment of the use of a transparent discrete units 55 and/or dyed discrete units 51, in the form of pellets in each of several photoluminescent color converter matrices 40. Each grouping may be placed over a single LED or grouping of LEDs. These groupings of LEDs may be distributed over a surface of any size. Multiple colors may also be used on each LED instead of the clear and color sections shown. Multiple LEDs may be placed under a single photoluminescent color converter matrix 40 or a grouping of photoluminescent color converter matrices 40. For example, 60 LEDs in 0.5-100 mm square grouping may be placed under a single photoluminescent color converter matrix 40 or grouping of photoluminescent color converter matrices 40, and then these groupings of LEDs and matrices may form larger groupings that are close packed or distributed around. In addition, lenses can be placed proximate or otherwise near each grouping of LEDs, or proximate or otherwise near the grouping as a whole, and a lens panel may be used with many lens elements on a single molded unit.

In addition, nanocrystals and nanoparticles (diameters typically under 500 nm, may be formed from the organic photoluminescent material and may be constructed around a nucleation particle such as a carbon bucky ball or carbon nanotube or one of many other cores such as a crystallite of an inorganic material or dye. In many embodiments, the nanocrystals and nanoparticles must be smaller in size than would significantly scatter the shortest wavelength light present in the material with the nanocrystals and nanoparticles. The nanocrystals and nanoparticles may be used as a substitute for dissolved photoluminescent dyes. Moreover, coating organic particles with encapsulating materials (squarine or perylene coated with cucurbituryl macrocycle) or forming structured materials such as nanocrystals may add stability to the core materials and minimize chemical reactivity, which can improve the luminance life. Forming nanocrystals may be achieved by first dissolving the dye in a solvent in which it has relatively high solubility, and then mixing in a solvent that may be compatible with the first solvent, but that the dye has a lower solubility in. The speed of this process and temperature may vary with dye materials and nanocrystal size desired. Aggregation of nanoparticles may be limited to minimize scattering. Nanofilaments may be formed from many photoluminescent dyes in the photoluminescent color converter matrix 40. Nanofilaments may be purely organic photoluminescent material in a polymer medium formed into thin discrete units 50 or a grown polymer "brush" from a patterned or self-nucleated base.

Furthermore, most dyes may be combined in a single polymer-transparent photoluminescent color converter matrix 40 to change the spectrum shape for a color. At very high concentrations or long lengths 53, any overlap of the emitted and absorption spectra of mixed photoluminescent dyes is translated into only the emitted wavelength range, thereby narrowing the spectra. A second dye may be used to further narrow the spectrum of light through a color converter element, such as photoluminescent color converter matrix 40. The first dye must have an absorption spectrum that extends into the emission spectrum of the second dye, but an emission spectrum below that of the first dye. Additional dyes with similar spectral characteristics may also be used. All dyes used would be at a sufficient concentration wavelength to fully convert all exciting light to their respective emission wavelengths. For example, Perylene dyes, including Perylene compounds from BASF® Lumogen F yellow 83 and Lumogen F Orange 240, create a saturated orange-red may be used as dyes. Those having skill in the art should appreciate that low concentration systems may use multiple dyes to broaden the spectra. In contrast, using very high efficiency materials with over 80% quantum yields may be mixed for practical narrow spectrum color sources. Some of these organic photoluminescent materials have almost 100% quantum yields. This is a significant deviation from common practice using low concentration dyes to widen an emitted light spectrum; the result may be an ability for using the mixing of dyes with overlapping absorption and emitting spectra to narrow a spectrum. Narrow spectrums may be important to flat panel display and other applications desiring saturated colors. Furthermore, the life expectancy of these mixed dyes at high concentrations and thickness 34 may permit useable product lifetimes before unacceptable color changes that are 10-10,000 times longer than if the lower concentration dyes were used alone. Accordingly, photoluminescent dyes need not be directly mixed to achieve this spectrum narrowing effect, and could alternatively be layered as long as the longest emitting wavelength spectrum photoluminescent dye is on the top or the emitting side of the photoluminescent color converter matrix 40. For example, using color converters in place of color filters on flat panel displays at the sub pixel level with blue source 20 LED may reduce the display power consumption for a LCD full-color video displays optical system by as much as 75%.

Additionally, dyes with polar characteristics (e.g., some of the squarines, either or both positive and negative charges in the dye, transparent polymer additive, or the matrix material such as polystyrene or sub units of the polymer itself), may be oriented in the polymer medium whether in solution or as nanoparticles. This may be done using electric fields and/or magnetic fields during the curing of the matrix medium or during heating sufficiently to permit alignment of the combined photoluminescent color converter matrix 40 materials. Pure or mixed transparent and/or photoluminescent materials may likewise be oriented. Different polarity materials in a matrix 40 constituting all or part of the spectral conversion device 100, 101 may be selectively oriented. Furthermore, chiral variations of these constituent materials may be combined and used to create unique optical characteristics. This technique may be used for some type of molecules to adjust light adsorption or emission directionality, birefringence, polarization, and other parameters of interest. This technique may be used separately on bulk photoluminescent color converter matrices 40, discrete units 50, such as fibers, ribbons, pellets, and also on coatings, fills, etc. The use of different melting point matrix materials and assembly after or before various treatments may be used to obtain multiple polarity orientations of materials within a given photoluminescent color converter matrix 40. Additionally, the discrete units 50, for example, fibers and ribbons, may be stretched or compressed individually before assembly or after assembly to change birefringence and other properties of various parts of the photoluminescent color converter matrix 40 (different compositions may be effected differently by these processes).

Moreover, combinations of these concentrated organic photoluminescent dye containing pixel converters and/or polar oriented materials be used at each subpixel of a flat-panel to create dual narrow spectrum light (mixed dye and single photoluminescent dyes in a matrix or pure also may be used to emit blue color range pixels (e.g., 460 nm) if blue converters are used with shorter wavelength LED containing sources such as 425 nm or 395 nm LEDs.) Small units or even photonic lattice patterns of elements within each pixel may be used to minimize light trapping and further narrow or adjust the color spectrum at each pixel. These small sub-units of pixel color converters may be variations of cylinders, domes, blocks, arrays of stripes, or other patterns and may be photoluminescent dyes, mixes of dyes, or layers of photoluminescent dyes and non-photoluminescent dyes and transparent materials, and/or different birefringence and index or refraction materials and matrix materials as may be required to obtain the desired optical properties of the overall display. (e.g., a 10×10 micron pixel may have a photonic lattice design of 600 micron pitch stacks of a transparent layer, then dual mix PL in matrix, followed by a higher color non-PL dye in a polymer matrix. Also, color converters at the pixels in or on a display screen and at the backlight light source 20 may be used in combination to optimize color and input spectrum to the flat panel displays for various applications. Two or more wavelength LED types may be used to drive the backlight or front light of the LCD display such as a combination of 430 nm, 450 nm, and/or 470 nm purple to blue range LEDs. The LCD displays discussed herein include all type LCD displays such as all TFTs, ferroelectric LCDs, etc. In addition, OLED displays and light sources may utilize this new disclosed technology effectively using blue OLEDs and color converters instead of filters.

Further examples of permissible dye concentrations for the spectral conversion device 100 may include 100 to over 1000 times more photoluminescent dye in a thickness 34 multiplied by the concentration combination (i.e. total dye used is 100-1000+ times higher in any combination of thickness and concentration, where significant agglomeration of dye or light scattering due to the dye concentration has not yet occurred) than is needed to initially achieve extinction of the before-photoluminescent color converter matrix 40 light source 20 wavelengths being used to drive the spectral conversion device 100, 101. Obtaining higher than normal concentrations of dyes in photoluminescent color converter matrices 40 may be aided by heated ultrasonic mixing of dyes and photoluminescent color converter matrices 40. However, when using heated ultrasonic mixing, any bubbles introduced must be removed (e.g., by settling, adsorption of gas or vapor, centrifuge, or filtering), a proper solvent must be chosen, and depending on the materials being used, the optional addition of certain additives must be available. The amount of dye should be sufficient to last until the end of life of the product at the intensity of light the converter is to be radiated with. Concentration of several photoluminescent dyes may be used this way with minimal light losses. Techniques required to effectively achieve these concentrations over 0.02% without agglomeration may include ultrasonic agitation of the dye and transparent matrix mix using high solubility solvents keyed for the dyes used. For example, dimethyl fomamide and/or toluene may be used as a solvent for the above example where both dyes can go into solution to obtain 1-2 wt % or higher concentrations 31 to PPMA (Acrylic) or polystyrene color converters which would then be dried after coating.

Figure 10:
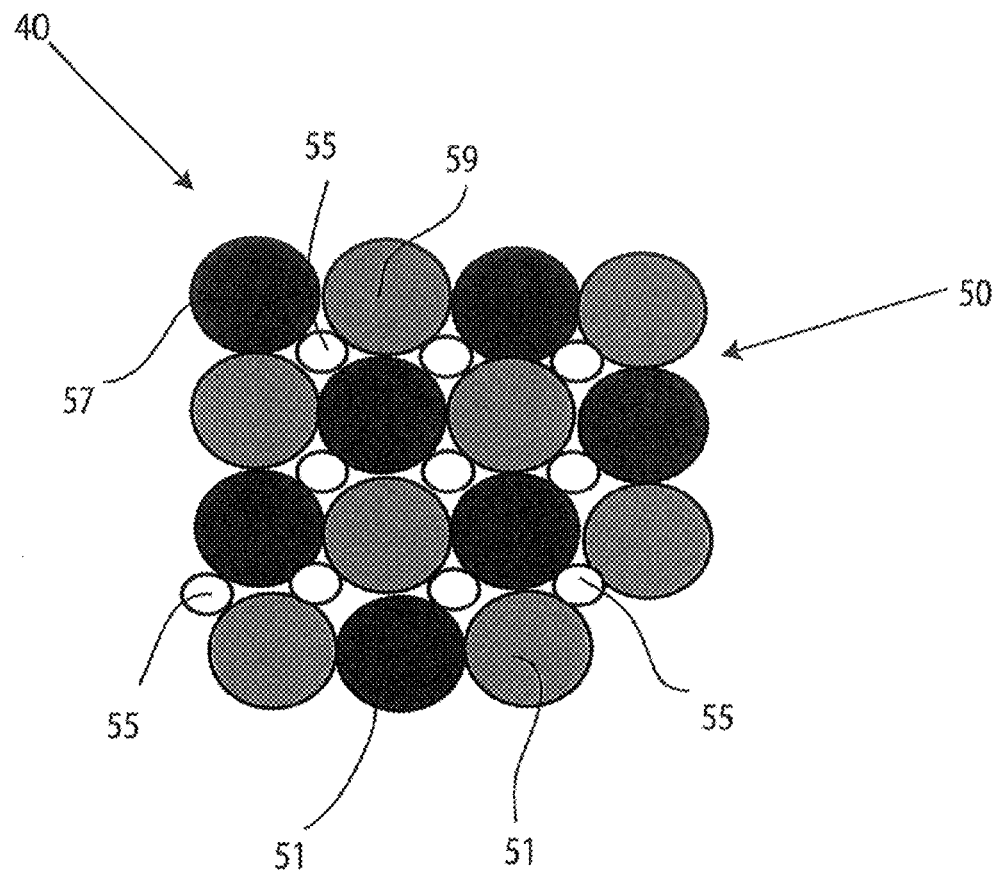
FIG. 10 depicts a top view of an embodiment of a discrete unit matrix, the discrete units having different sizes and dyes.
Figure 11A:
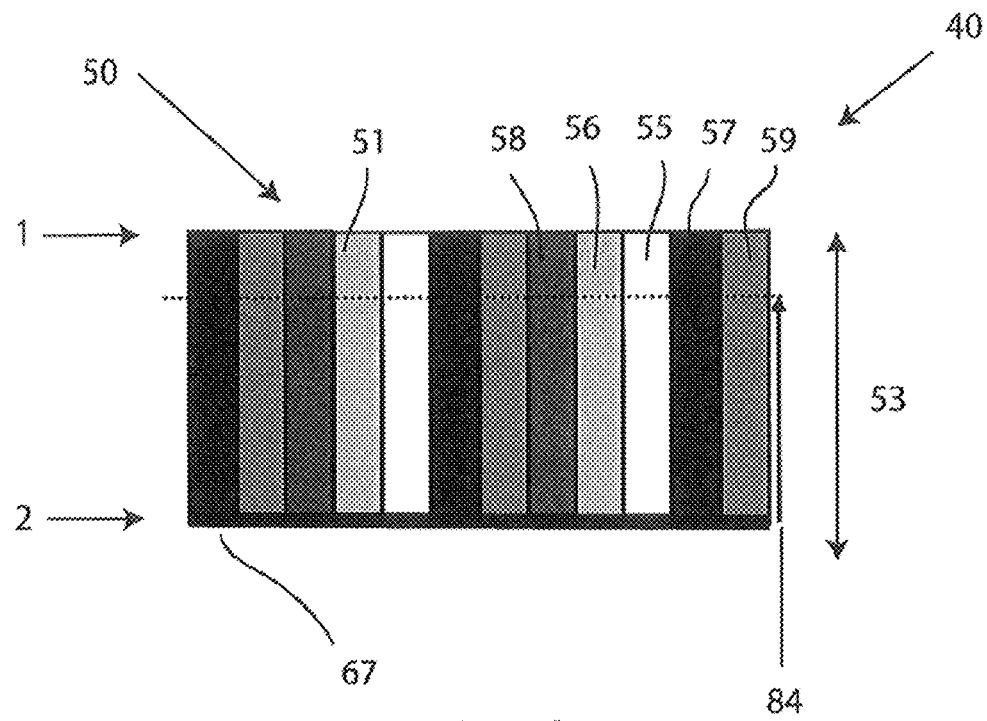
FIG. 11A depicts a cross-section view of an embodiment of discrete unit matrix optically coated with low index of refraction material(s)
Figure 11B:
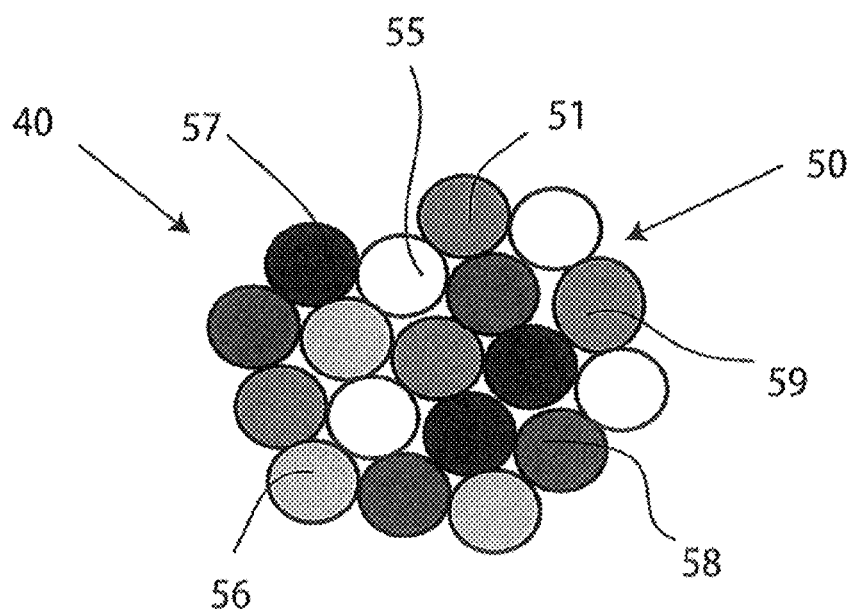
FIG. 11B depicts a top view of an embodiment of a discrete unit matrix optically coated.
Figure 12:
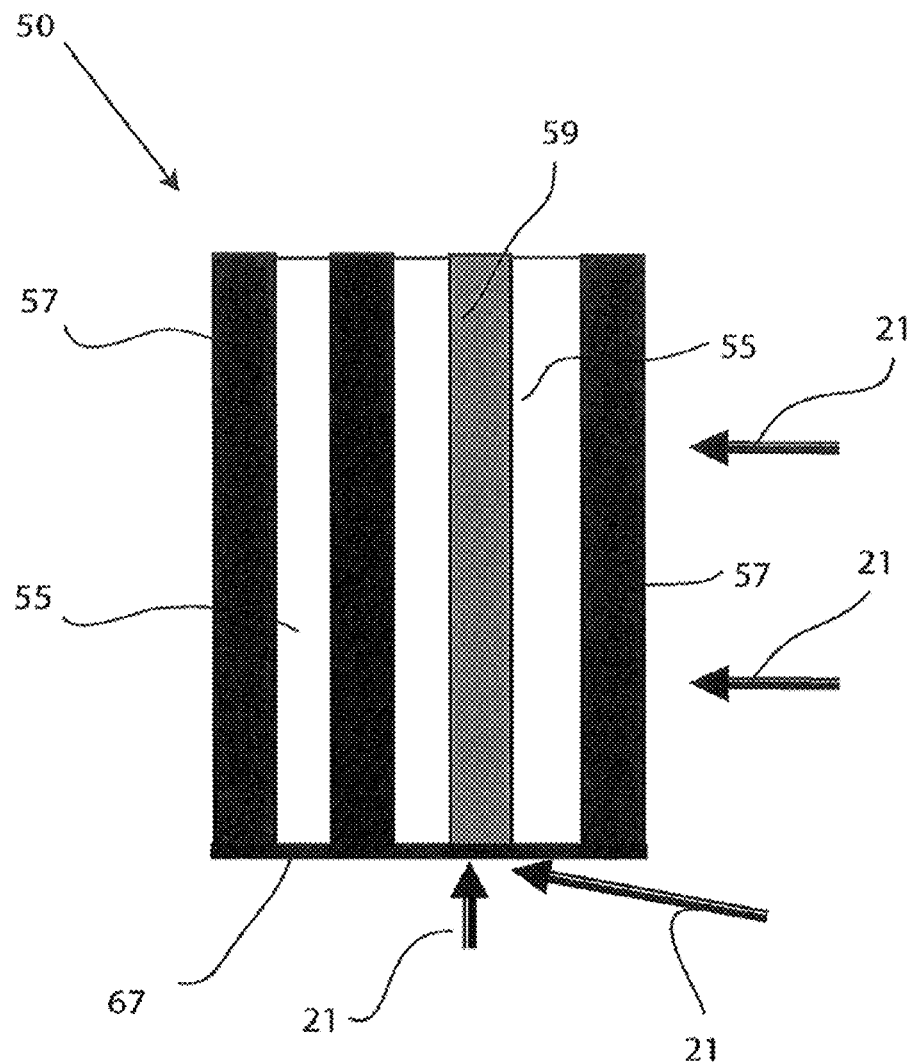
FIG. 12 depicts a side view of an embodiment of light contacting the discrete unit matrix from the side and/or end.

Referring now to FIGS. 10-15, embodiments of a spectral conversion device 100 may include a photoluminescent color converter matrix 40 having a large number of small diameter fiber optics, such as discrete units 50, closely packed, essentially forming a substrate. Each discrete unit 50 may contain a photoluminescent dye coated with a lower index of refraction material and a reflective non transmitting coating. Transparent discrete units 55 making up the plurality of discrete units 50 may only benefit from the high refractive index coating, although the secondary reflective coating might not significantly reduce the effectively of the device. Various size discrete units 50 may be used in the photoluminescent color converter matrix 40. Varying the sizes of the discrete units 50 may adjust the spectrum, or just reduce the fill area between discrete units 50, especially when round cross section materials are used, as depicted in FIG. 10. When optically coated discrete units 50, such as fibers or coated long pellets (over twice as tall as wide) are placed close together with minimal wasted distance between the units 50, directionality of the exiting converted and transmitted light 25 can be enhanced, which may be desirable for many lighting applications. Sometimes organic photoluminescent materials and phosphors do not provide much light emission directionality; therefore, mirrors and lenses may be used to increase directionality of light for spot lights and for directing light into special shaped light channels. Therefore this method may provide an improved directionality with minimal light loss. Some examples may include spot lights and ribbon light channels for flat lighting and LCD backlights. The combination of photoluminescent dyed discrete unites 51 and transparent discrete units 55 that are optically coated may be used to create directionality that would normally not be present in photoluminescent converting materials. The optical discrete units 50 may be coated with layers of a lower index of refraction material than the discrete unit 50 material. This coating should be as thin as appreciated by those having skill in the art (e.g. 0.01-10 microns thick coating), unless being used as part of the spacing. This adds directionality and reduces unit-to-unit crosstalk in high density arrays. For example, the photoluminescent color converter matrix 40 may include magnesium fluoride, silicon dioxide, PTFE (polytetrafluoroethylene or polytetrafluoroethene), perfluoroalkoxy polymer resin (PFA), (fluorinated ethylene-propylene) (FEP) and other materials on PMMA, polystyrene, polycarbonate, or polyurethane fibers or pellets. Multilayer dielectric coatings can also be used. Even more examples may include a thin coating of lower index of refraction polymer than discrete unit 50 such as polystyrene with a novalac resin coatin, metallic reflector coatings on fibers or pellets are also claimed such as thin films of aluminum, silver, or chromium, combinations of layered dielectric and metal films can also work as coatings. Fibers or higher aspect ratio pellets may provide increased directionality as long the height to width ratio is greater than 1.5:1 above the end-of-life height. The end-of-life height 84 is the designed target end of life point for the product when at the expected average input luminance X input energy, dye concentration, height, and other degradation factors are expected to have significantly photodegraded the organic photoluminescent materials.

Moreover, high index of refraction coatings may also be used if there is a desire to channel light through these coatings instead of the discrete units 50, including other optical advantages depending on the application. This might be the case when using a fiber as a pumping column and/or when an open center beam is desired. The fill material, the coatings, and the fibers may all be different index of refraction and there could be several different fiber coatings. Additionally, the area between the fibers or pellets may be filled with a transparent or photoluminescent doped filler material; for example, PTFE (poly(tetrafluoroethylene) or poly(tetrafluoroethene), PFA (perfluoroalkoxy polymer resin), FEP (fluorinated ethylenepropylene), or other low index of refraction material. This would tend to redirect scattered light lost from fibers, or discrete units 50, back into the fibers, and considerable light from any photoluminescent emission in the fill would leak back into the fibers. Optionally, higher index of refraction fill and secondary coating materials may also be used because the coating on the fibers would also tend to collimate the light in the fibers or ribbons and the fill zone. The inverse of fibers or ribbons, such as an array of gaps 71 may be implemented. Three or more unit discrete unit 50 (e.g., pellet, fiber, and/or ribbon) coating layers may be used, depending on the design objectives.

Additionally, opaque or high index material may be used as filler. In one embodiment, the use of opaque materials should be kept to a minimum unless the fibers or pellets are seated in a separate source to avoid waste of energy through wasted photon absorption. For applications requiring optimal directionality, the opaque fillers may be an acceptable sacrifice, and may be a small percentage of the cross section of the photoluminescent color converter matrix 40. When high index of refraction materials are used for a fill to permit light to pass or be converted to another color between the fibers or pellets, best results may be obtained when the coating on the fibers or pellets is lower than both the fibers or pellets and the filler materials. Design consideration may be needed for the potential different exit angle distribution from the different index or refraction materials which can cause a color shift with viewing angle. However, in some designs where a lens or concentrator or light distributor is used that sufficiently diffuses the light, this may not be an issue. Color change with angle may also not be an issue when arrays of many converters and LEDs are grouped and the angle differences are averaged. Corrections are possible with multiple angle sources and variations of the surface shapes of the discrete units 50, in particular, fibers and/or pellets, or fill. Lastly, for some applications, color shift or luminance change with angle may be desired for some applications and can be optimized for special lighting effects and relative positioning instruments.

Discrete units 50, in the form of fibers or pellets may be many shapes and fillers and/or coatings, and may consist of many materials. However, the filler should typically be a lower index of refraction than the fiber coating if they are undoped or not highly doped with longest life material in the photoluminescent color converter matrix 40. This may prevent incident light to be converted from leaking and photodegrading a material from the sides. Fibers may also be pressed and reshaped to minimize space between fibers. As mentioned herein, the photoluminescent color converter matrix 40 may be positioned over an LED or grouping of LEDs. Furthermore, the mixture of color converter dyes in various pellets or fibers may be used to create a special spectrum; mixtures of selected dyes may be used to narrow the emission spectrum in a single converter section; and multiple narrow spectrum dye-mix fibers or pellets can be used to create a multiple narrow band section. A combination of all the same dyed fibers or pellets may be used over an LED or grouping of LEDs for directional light of one converted color. If the pellets 62 have a high index or refraction material coated on top and/or bottom, optimal efficiency may be obtained by polishing or etching off the top and bottom coating after bonding the pieces together.

Furthermore, up to 100% photoluminescent dye and mixtures of dyes may be used in all the proposed structures. The highest dye concentration may be used up to where the dye's aggregation results in a significant reduction of quantum yield, or the mixture of dyes result in a reduction of quantum yield. Furthermore, the dyes may be directly dissolved in solvents, left as particles, melted, extruded, grown, or pulled. Similar photoluminescent color converter matrices 40, as mentioned herein, may be used, but also including single dye, dye mixture, and polymer-dye mixtures as micro and nanoparticles that are crystalline, polycrystalline, amorphous, or composites and any of these forms. Mixtures of concentrated dyes may be used to create a narrower spectrum than typical mixed low concentration dyes. Fibers, pellets, solutions, castings, or coatings may be considered for use. Moreover, micro and nanoparticles of single color dyes and/or mixtures of various dye particles can be used. Small particles may be pressed together or used individually. These materials may be aggregated, compressed, or otherwise combined with binders or adhesives into larger nanoparticles, microparticles, other size particles, fibers, extrusions, castings, or coatings. Applications requiring narrow spectrum photoluminescent emitter materials may use small particles with mixtures of organic luminophors at high concentrations within the nano or micro particle, or larger shaped structure. Particles of high concentration or pure photoluminescent materials can be placed in solutions, coatings, or attached to other nanoparticles and chemical compounds to react with specific compounds, especially for (nano and/or micro) particles and/or crystals of high concentration (0.02% up to 100% dye(s)) of pure PL dyes and/or PL dye mixtures. Nanocrystals and nanoparticles of a single dye or mixtures of nanocrystals may be combined into larger nanoparticles, microparticles, other size particles, castings, or coatings. In some cases, inorganic phosphor grains can be combined into high concentration organic dyes, dye mixtures, and solutions of dyes and dye mixtures to create unique emission and adsorption spectrum and narrower right shifted emission spectra. Some efficiency would be lost over all high quantum yield photoluminescent material mixtures, but the additional spectral choices may merit the efficiency loss on some applications such displays and imaging applications. A left shift spectrum is also possible and anticipated, although right shift of spectrum is usually more practical. Mixing high concentration, over 60% quantum efficiency dyes with overlapping characteristics will result in a right spectral shift. Some organic photoluminescent compounds and/or inorganic phosphors are not compatible. Some organic materials will aggregate and self quench. Dye particles can be suspended in another dye or solution or one or more dyes (best if particles and host dye or matrix have similar indices of refraction). If long luminance life at high intensities is required, all dyes can be mixed at appropriate concentrations so as to degrade as a similar linear distant rate with time, and sufficient dye must be present to last the life of the product, unless a color change with exposure dose is desired.

Referring still to the drawings, creating oriented arrays of columnar pellets may be another process for forming vertical arrays from pellets or short fibers by first forming the arrays of organic photoluminescent materials elements. Specifically:

Formed by combining a chosen selection of optically coated with high index of refraction material color and/or transparent PL fibers using a glue, binder, or other means to hold them together. An adhesive used in this example should be easy to dissolve later without damaging the fiber materials (e.g., polyvinyl alcohol in alcohol or a commercial product like Aquabond 55 water soluable adhesive). (The key here is to have a temporary bonding material to hold fibers together during cutting and polishing that can be removed with insignificant damage to the pellets or fibers) that can later be removed. This bundle is then sliced to create wafers of the desired thickness The top and bottom surfaces of the wafers can be optionally polished, depending on the smoothness of the sawing process. Polishing or other surface preparation(s) to obtain suitable light acceptance and exit angle characteristics would be typically desired. In one exemplary embodiment, one having skill in the art could adhere to the following steps:

Self-alignment of long fiber alternative: Slightly dissolve a small amount of the soluble adhesive (e.g., 0.01-0.5 mm). One side of the wafer can be coated with a magnetic material such as nickel or a magnetic nickel alloy (e.g., the film can be deposited by any number of methods such as sputtering or ebeam evaporation. Thickness can be from 0.01 micron to 500 microns). Dissolve the entire soluble adhesive to separate the small fibers. Place the fibers in a solution of transparent or dyed polymer (or other clear solid or semi-solid matrix materials such as PMMA, polystyrene, polyurethane, UV or time curable epoxy, etc. . . . ), but select the matrix material solvent so as not to significantly dissolve the small fibers or their optional coatings. Coat the mixture of fibers and matrix materials on the surface of a base material (e.g., glass, sapphire, transparent plastic, or other transparent material). Film thickness can be thicker, same as, or thinner than the fiber length. For this example we will use almost the same thickness as the fiber length. Use a magnetic field to orient the fibers or pellets upward while the matrix film is a liquid. (downward orientation will also work if the lower substrate is later removed). Dry or cure the film. Polish or clean the top surface. Etch the remaining nickel or nickel alloy away, unless the magnetic layer removed by polishing.

A similar process could be used to orient the pellets or fibers using an electric field instead of a magnetic field. In one embodiment, the magnetic layer could be replaced with many conductors or dielectric layers materials with trapped charge or charged organic compounds. Then an electric field could be used to orient the fibers before drying or curing the matrix material or adhesive. The resulting structure should be an array or vertically oriented fibers or pellets in a photoluminescent color converter matrix 40. Multiple color and transparent fibers, or discrete units 50, may be used to achieve the desired spectral characteristics.

Referring again to FIGS. 12-15, spectral conversion device 103 may include an array of discrete units 50, such as fibers as described supra, assembled to form arrays of dye lasers 80. Embodiments associated with dye lasers 80 may potentially be useful for biological, backlight driver display, front light image projector, very directional spotlights, color holography, confocal and high intensity fluorescent microscopy, and many other applications. The arrays of dye lasers 80 can be formed as previously discussed, except that a scattering light path may be provided between the discrete units 50 used for the actual dye lasers 80. The same dyes and photoluminescent color converter matrix 40 materials may be used for disclosed supra. In one embodiment, BASF® 240 orange in PMMA at 0.2% may be used as a dye laser 80, but higher concentrations of this dye may be better for longer laser life; dye mixtures (such as this dye mixed with BASF® Yellow 083) can further narrow the output spectra. In addition, a concentration lower than 0.2% may provide an exemplary embodiment. This unique structured bundle of dye lasers 80 may have unique capabilities for multiple colors (red 87, green 89, blue 81, orange 88, yellow 86, and other colors), directionality, small size, and a way for individual color controls. Pure formed dyes may also work as lasers. Furthermore, single crystal dyes (i.e. these are small grown columnar crystals or large crystals cut to shape like is done with silicon and other semiconductor crystal ingots) or grown polymer dyed nanofibers and/or the spaces between the discrete units 50 could also be used to create lasers. It is also possible to implement filamentary single crystals of the dyes to form lasers and microlasers. One or more type nanocrystal or nanoparticle may be placed in another dye and/or transparent matrix of the dye lasers 80 (that can also contain one or more dissolved or nanoparticle imbedded dyes) as long as scattering is minimized in the material being used for the laser.

Figure 14:
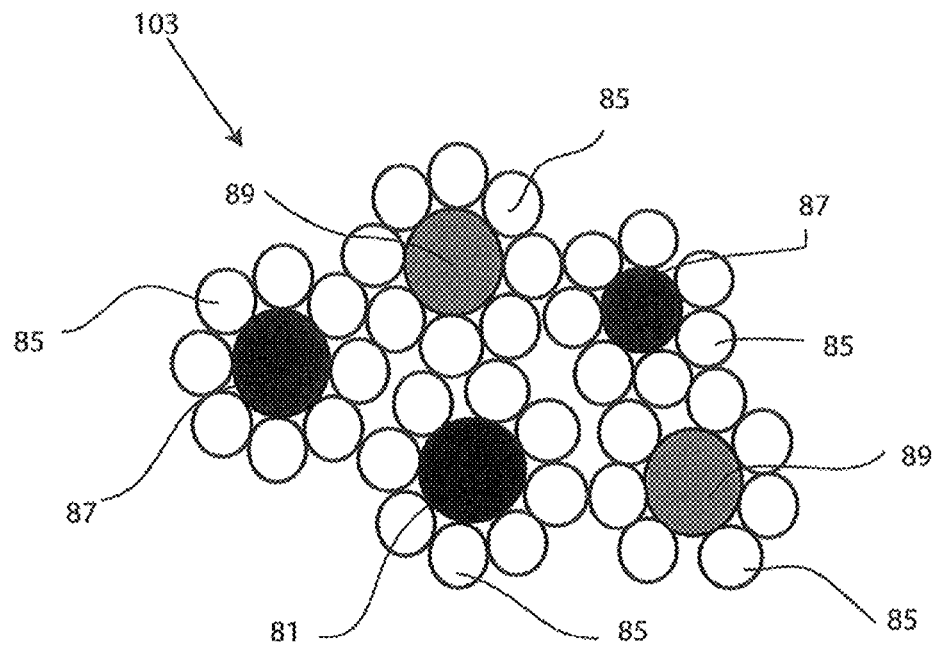
FIG. 14 depicts a top view of an embodiment of a discrete unit matrix, wherein the discrete units include laser rods of more than one color and transparent units.
Figure 15:
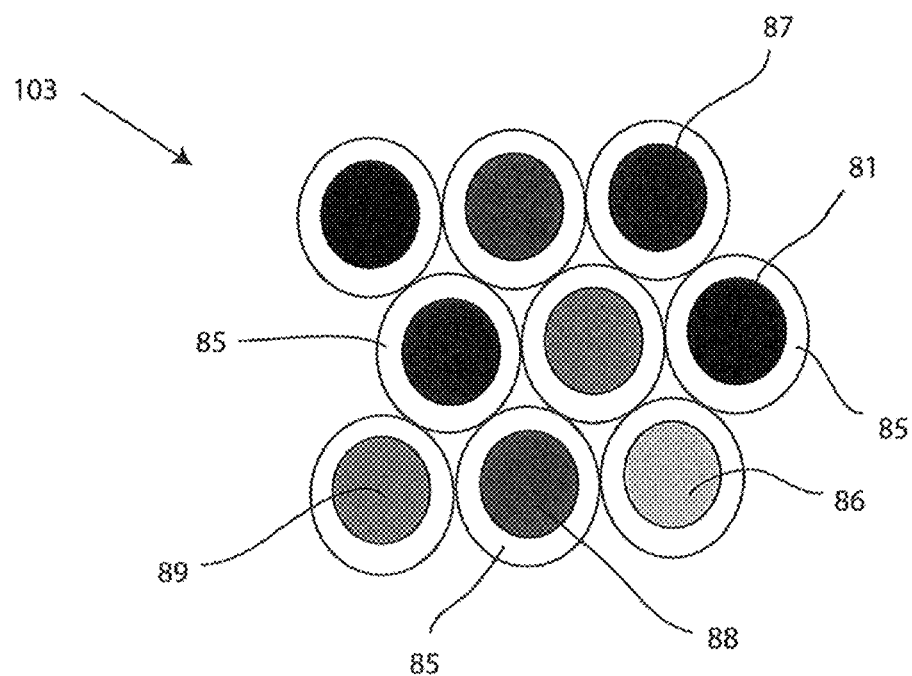
FIG. 15 depicts a top view of an embodiment of a discrete unit matrix, wherein the discrete units include laser rods of more than one color surrounded by transparent units.

Referring now to FIGS. 14-15, any combination or subset of UV, visible, and infrared wavelength range dye lasers 80 can potentially be combined. The dye lasers 80 may be formed in a similar way as the discrete units 50; however the dye lasers require: (a) either very uniform smooth cutting or polishing on both ends of the rods, and (b) a full mirror at one end (e,g, aluminum or a highly reflective dielectric and metal stack on one side, and a partly silvered mirror on the other end (e.g., thin partly transparent aluminum or silver). Bragg, Fabray, photonic lattice pattern, crystal, grating, or thin film full and partial reflectors can also be used as design dictates. Filler between the dye lasers 80 may be made with imbedded microparticles for scattering and/or long life dye particles or inorganic phosphor particles (also known as "pumping columns"). In this case, scattering may be desirable (e.g., glass, spheres, particles, etc. . . . ). These pumping columns 85 may be the filler between the dye lasers 80 or formed from separate rods placed between and around the dye lasers 80. The pumping columns 85 may also be pre-formed coatings on the dye lasers 80. The positions of the filler 85 and dye lasers 80 may be reversed so the dye lasers 80 surround a pumping column 85; the dye lasers 80 may be where the filler is shown between the fibers of pumping rods, cylinders, ribbons, etc. Scattering materials may be any material that will scatter light, with a preference for materials with minimal light absorption. (e.g., clear alumina crystals or particles in a PMMA, polystyrene, or polyurethane matrix). Particles of inorganic phosphor or long life organic photoluminescent materials such as nanocrystals may also be used in a transparent medium. Then the particles can absorb the incident light and remit the excitation wavelength horizontally to pump the laser dye lasers 80. If this phosphor in the pumping column 85 technique is used, an LED wavelength that will adsorb and excite the phosphor in the pumping column may be used. A phosphor may be selected for use in the pumping column that will emit at a wavelength necessary to pump the dye laser material(s).

The density of scattering or phosphor may be graded with length or uniform depending on the design and length of the lasers. The driving LEDs (e.g., LED wavelength matching the photoluminescent pumping column material absorption or the absorption spectrum of the dye lasers 80, or laser rods, may be aligned to pumping column matrix material 85 between the dye lasers 80. A similar embodiment with aligned LEDs with separate LEDs for various drivers, individual control of the various LEDs may be used to change the color and color mix. Individual control may also be used to change the relative intensities of the various laser rods 83. Various color dye lasers 80 and pumping columns 85 can be grouped and separated so that complete individual control or color and intensity is possible. LED controls can be as a fixed control group, or any combination of LED and LED control arrangements. Common groups of driver LEDs or groupings of various LEDs can be organized and separated in almost any configuration. Stated again, different LED types can also be used as is optimal for each type material, which should be appreciated by those having skill in the art. For example, scattering pumping columns 85 could be used to pump one or more blue lasers 81 with UV LED source(s), blue LED(s) could be used to pump green dye lasers 89, and green LED(s) could be used to pump red dye lasers 87. In another example, all dye lasers 80 could be pumped by a single type UV LED. The laser rod dyes may be chosen which become excited by the same UV wavelength using scattering pumping columns or a common phosphor in the pumping columns 85. Alternatively, different phosphors may be used in different pumping columns 85 where all phosphors could be selected that absorb the same UV wavelength and emit more optimized pumping wavelengths to more optimally drive different type photoluminescent dye lasers 80. Additionally, different LEDs may be used to drive combinations of different pumping column phosphors, scattering pumping columns, ribbons or cylinders, and/or photoluminescent laser rods, ribbons or cylinders. Laser diodes and other light sources can be substituted for LEDs.

Moreover, multiple dye lasers 80 can be used to reduce laser speckle by mixing several slightly different dye types and/or pumping column 85 materials into various laser columns. For example, two or more different red laser rod 87 variations may be made with different concentration ratios of photoluminescent red dye and photoluminescent orange dye that have at least some small adsorption-emission overlap, and may act to create several color red lasers 87 with wavelengths that are a few nanometers apart. While still red, phase and monochromatic character would reduce visible speckle. Many variations of a color are possible, with a larger numbers of slightly different color laser rods 80 providing ever less visible speckle. This same technique could be used for almost any target center wavelength, which still maintaining high intensity and directionality. For example, this technique could be especially useful for high efficiency red-green-blue (RGB) light sources for small size image projectors using digital mirror arrays, LCDs, diffraction arrays, or mirror scanners. Each primary laser color such as red, green, or blue would each have several small color variations. The laser could be UV or near UV pumped using LEDs, multiple LEDs with different spectral output attached to the PL materials absorption, or other suitable light sources. The result can be a very directional, bright, low heat, and low power projector light source with high directionality.

Figure 16:
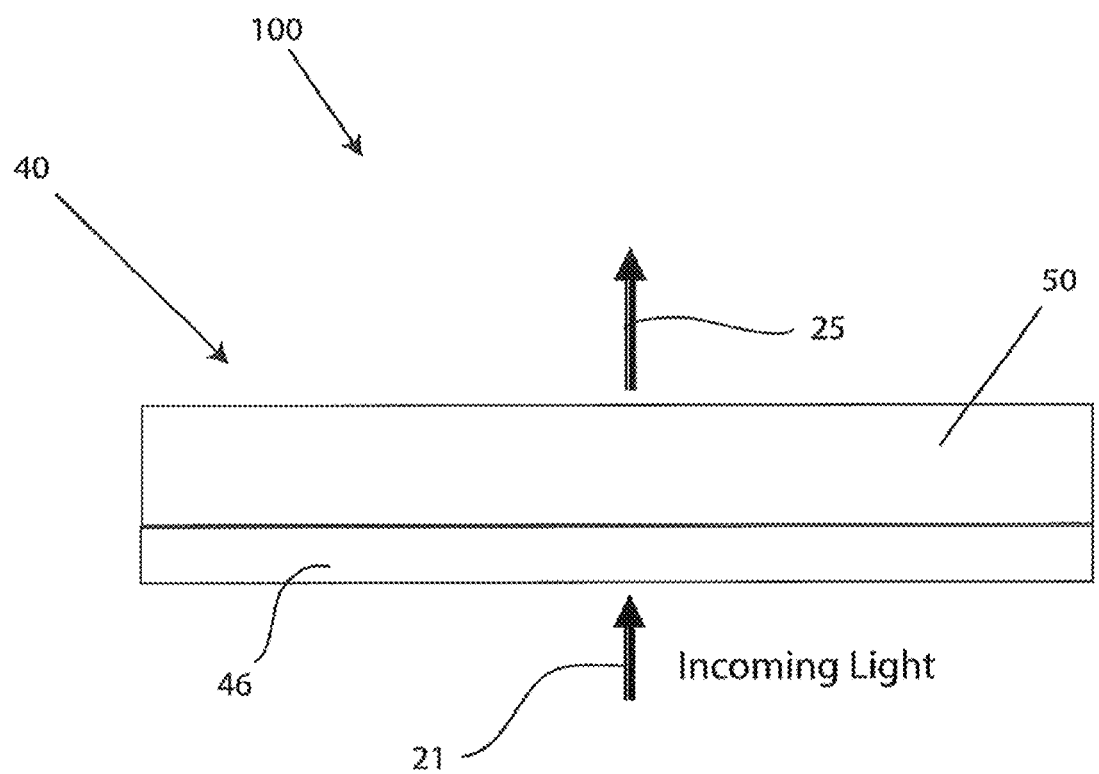
FIG. 16 depicts a schematic view of an embodiment of a photoluminescent color converter matrix with fill.

Referring still to the drawings, FIG. 16 demonstrates a large array of a plurality of discrete units 50, in particular, fibers, grown on a substrate, such as a clear base 46. Individual fibers may be the same or different colors, transparent, or have different optical properties if grown from different seed layers that are selectively activated. Fill, or binder material 45, may be dyed or have other optical properties. Alternating or other arrangements of fibers or ribbons may be used for light amplification and polarization modification. Reflectors may be placed under the fibers in the areas before growth, or between fibers, or under only selected fibers to that light can be channeled or reflected from different sources. Light can enter such an array from either side. Vanadium oxide and other switchable materials can be used to rapidly switch light through portions of the array. A filter to pass the incoming light and reflect all other wavelengths other than the incoming light side can improve the conversion efficiency of embodiments with photoluminescent converter materials in the array. An optional filter, such as a dichroic filter, to pass incoming light and reflect back other wavelengths into the fibers may be used.

Figure 17A:
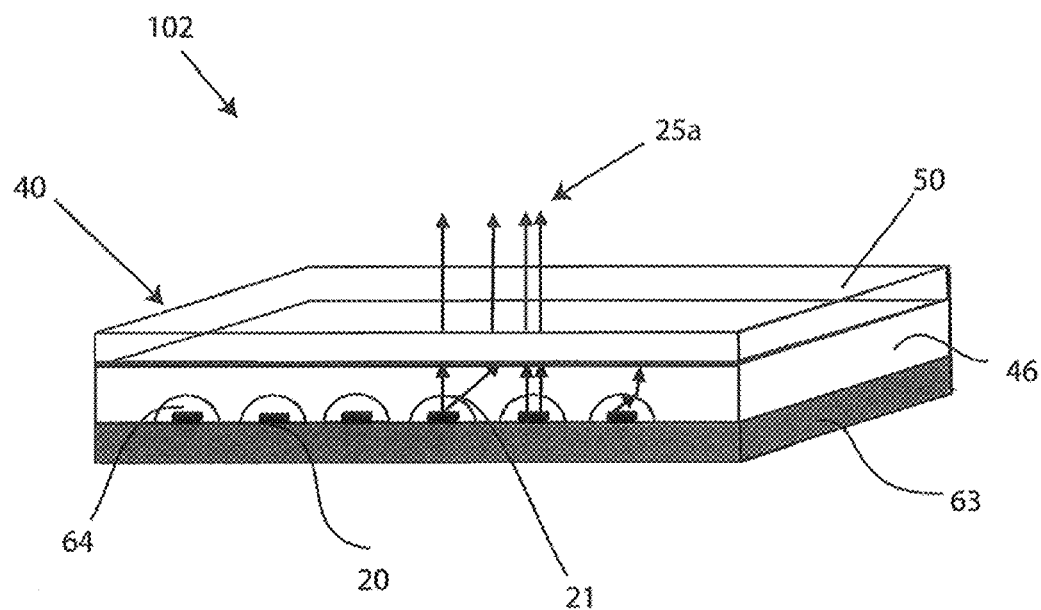
FIG. 17A depicts a perspective, cross section view of an embodiment of photoluminescent color converter matrix positioned over an array of LEDs.

FIG. 17A depicts an embodiment of spectral conversion device 102 having an array of discrete units 50 and/or photoluminescent color converter matrix 40 above a grid of blue LED sources 20 to create a RGB spectrum 24 light source with narrow spectrums of each Red, Green, and Blue light as may be used with a light controlling flat panel display with color filters (the spectra could be tuned to match the color filters for best energy efficiency). The spectral conversion device 100, 102 may include one or more photoluminescent color conversion matrices 40 corresponding to an individual color element of an image display device 200 having a plurality of light switches 91, wherein the one or more photoluminescent matrices 40 provide an output spectrum for the corresponding individual color element, wherein the photoluminescent color conversion matrices 40 include a plurality of discrete units 50, the plurality of discrete units 50 including transparent discrete units 55 and dyed discrete units 51, wherein the dyed discrete units 51 are dyed with a photoluminescent material at a concentration greater than or equal to an amount sufficient to absorb and convert substantially all input light from a light source to a desired output spectrum, and a coating material disposed around the plurality of discrete units 50, wherein the coating material binds the plurality of discrete units 50 to form the color conversion matrix 40, further wherein a thickness of the coating material determines the distance between each of the plurality of discrete units 50. One or more of the photoluminescent color conversion matrices 40 may include a cooling means such as air, water, heatsink, etc, while operably configured with a flat panel image display device. Moreover, the plurality of discrete units 50, with or without the photoluminescent material, are arranged to amplify a spectrum shift and a shift of the polarization of light due to evanescent interactions of light in alternating portions of the one or more color conversion matrices.

The array of discrete units 50 may include both transparent discrete units 55 and dyed discrete units 51, wherein coating material may hold together the discrete units 50, acting as the binder material 45, the thickness of which may determine the amount of space between the discrete units 50. Additionally, the arrays may be aligned to the display array for higher efficiency or reduction in the blocking of the color filters or elimination of the upper color filters. One exemplary embodiment involves a flat assembly that may have a pixel-level light controlling flat panel display placed above it (such as an LCD display of any kind) or to drive one or more transmissive or reflective projector displays, but the assembly may be made in many shapes, and single color or any number of colors may work.

Figure 17B:
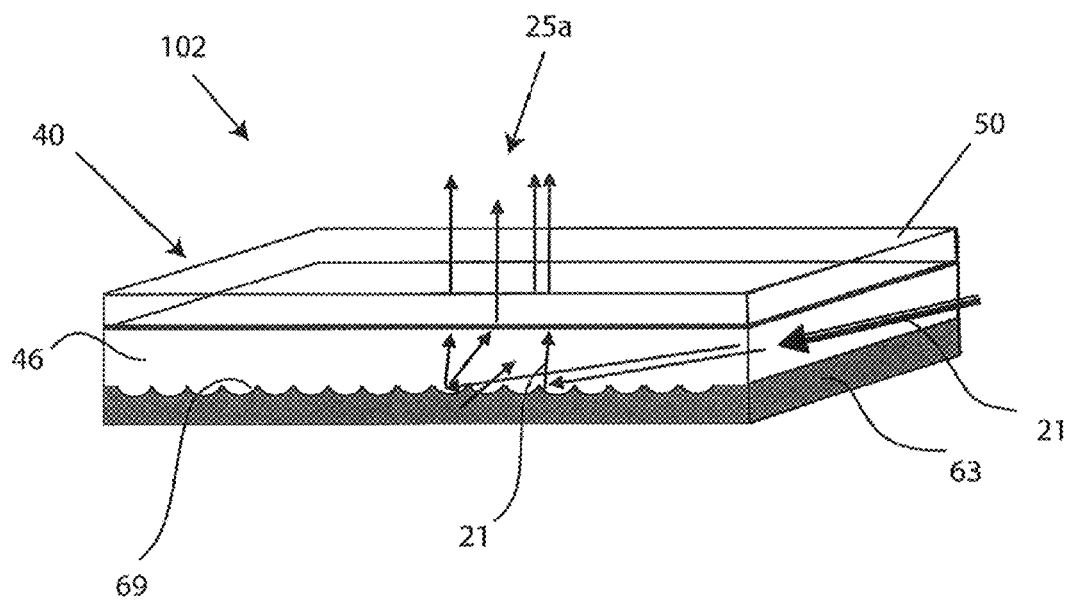
FIG. 17B depicts a perspective, cross section view of an embodiment of photoluminescent color converter matrix positioned over a light channel plate with side mounted LEDs.

FIG. 17B depicts an embodiment of a spectral conversion device 102 having a photoluminescent color converter matrix 40 array above a light guide pumped from the side by blue LEDs to create a RGB output spectrum light 25a with narrow spectrums of each Red, Green, and Blue light as may be used in an LCD flat panel display with color. A reflective light guide 69 with surface structures or indentions (e.g. cut or molded) may be used to preferentially scatter light upward. This surface reflectivity may also be locally controlled using switchable reflectors such as W:VO$_2$. Additionally, optional molded, film, photonic lattice array or cavities may be used to direct most light upward. The photoluminescent color converter matrix 40 may be made to reflect incident side light downward, and then a flat highly reflectivity optical film or coating on this base can be used. Reflective structures 69 (shown as parabolic indentations in FIG. 17B) may be faceted or curved and be laid out as lines, grids, or spot patterns. Metal coatings and other films including nano-microstructures may further improve reflectivity. Transparent material(s) should be stable with the photoluminescent color converter matrix 40 and maximize light into the photoluminescent color converter matrix 40. This material may consist of multiple layers (only one layer is shown). Other style light guides of translucent material that can direct light across the area to be illuminated and direct light upward may also be used, including fiber optic bundles. Mirror structures may be built into the photoluminescent color converter matrix 40 array to reflect incoming light from the side directed upwards back down to a mirror and then back up into the array. Also, the discrete units 50 in the photoluminescent color converter matrix 40 array may be angled to accept light at a side angle. For example, the lower ends of the units may be angled at 45 degrees and optionally coated with a suitable dichroic mirror for 45 degree angle acceptance.

Figure 18:
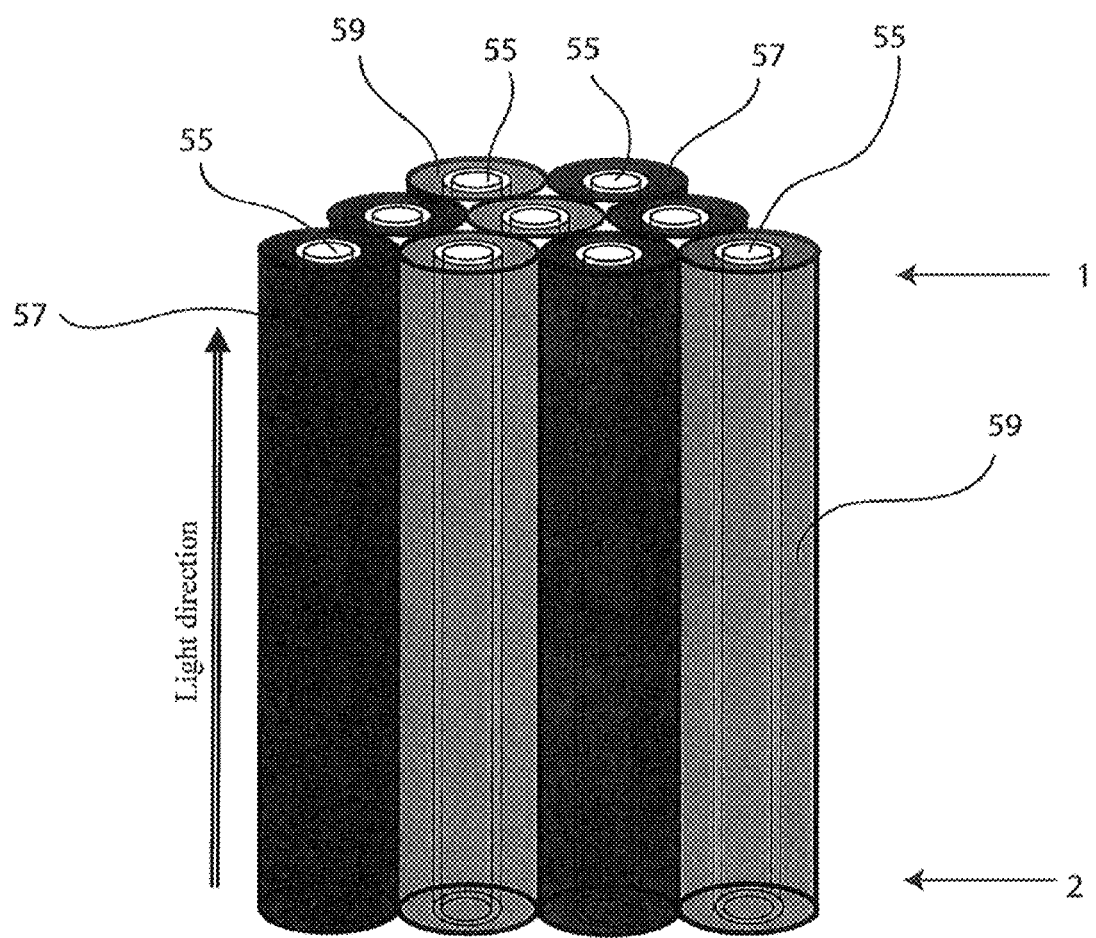
FIG. 18 depicts a schematic view of an embodiment of discrete unit matrix, wherein each discrete unit includes an inner unit.

Referring now to FIG. 18, high performance color conversion to RGB may be achieved. For purposes of providing an example, assume the photoluminescent color converter matrix 40 having dimensions of 6 mm square by 2 mm thick (dimensions may vary according to desired characteristics, properties, results, etc). The internal transparent fibers 55 may be Mitsubishi 250 micron diameter SK-10 PMMA fiber with a fluorinated polymer coating as typically provided by the manufacturer. Starting fiber segment lengths may be long, such as 1 meter or longer. The fiber coatings may be 200 micron thick (1) BASF® Green 850 at 2.5% concentration in PMMA for Green columns and (2) the Red columns were 2% BASF® Red 305 concentration in PMMA. An outer coating of Teflon AF® of 20 micron (from a 1% solids solution of Teflon AF) may be applied after drying of the color coatings while the discrete units 50 are still separated. These coatings may be applied by extrusion or spray. The fibers may then be strung together into bundles in a random or organized arrangement as desired. The bundles may be placed in a form with movable sides (e.g. ~5×5 mm rectangular shape inside dimension) while the outermost coating is not yet dry. Alternatively, an additional adhesive such as PMMA in a solvent may be applied to thin coat the fibers. A thin liner may be placed in the form such as 20 micron film of Teflon® or polyethylene filter material or other slightly porous material to make separation from the form easier and still permit later drying. The form may then be used to press the fibers together and then removed. After drying (e.g., fresh air at 40 deg C. slowly increasing to 60 deg C. over 72 hours), the fiber bundles may be sectioned by sawing with a thin metal blade or under running water or coolant or a high pressure water saw. An approximately 1 meter long section could potentially yield about 400 or more 2 mm thick converters, taking sawing losses into account. These sections can then be polished in batch quantities with rotary sanders and other common polishing tools, optionally using polishing compound.

A thin low index of refraction coating (e.g., 1-50 microns) can be applied to the top and/or bottom, such as the Teflon AF fluoropolymer. Also, adhesive backed or thin film deposited green-through-red reflective dichroic mirrors or filters may be applied to an input side of the photoluminescent color converter matrix 40. The photoluminescent color converter matrix 40 may then be mounted over a grouping of 460 nm center wavelength blue LEDs with high reflectivity tape opening only the light output portion of the LED. A high reflectivity foil cone with a 20 degree slope (larger at the side) can be preformed and placed over the LED array to direct stray light upward. The LEDs (e.g., CRE XR-E-B) should be mounted on a heat sink able to handle the heat load and electrically connected by thin patterned lines, strips, or wires. These photoluminescent color converter matrix 40 and LED lamps can be placed into rows on the sides of light guides to illuminate LCD flat panel display light guides. The output spectrum should provide saturated RGB white light with blue, and red light peaks, suitable for flat panel display use. Overall energy efficiency in this application and color saturation would greatly exceed that produced by inorganic white phosphor mixes placed over the same type blue LEDs.

Figures 19A, 19B:
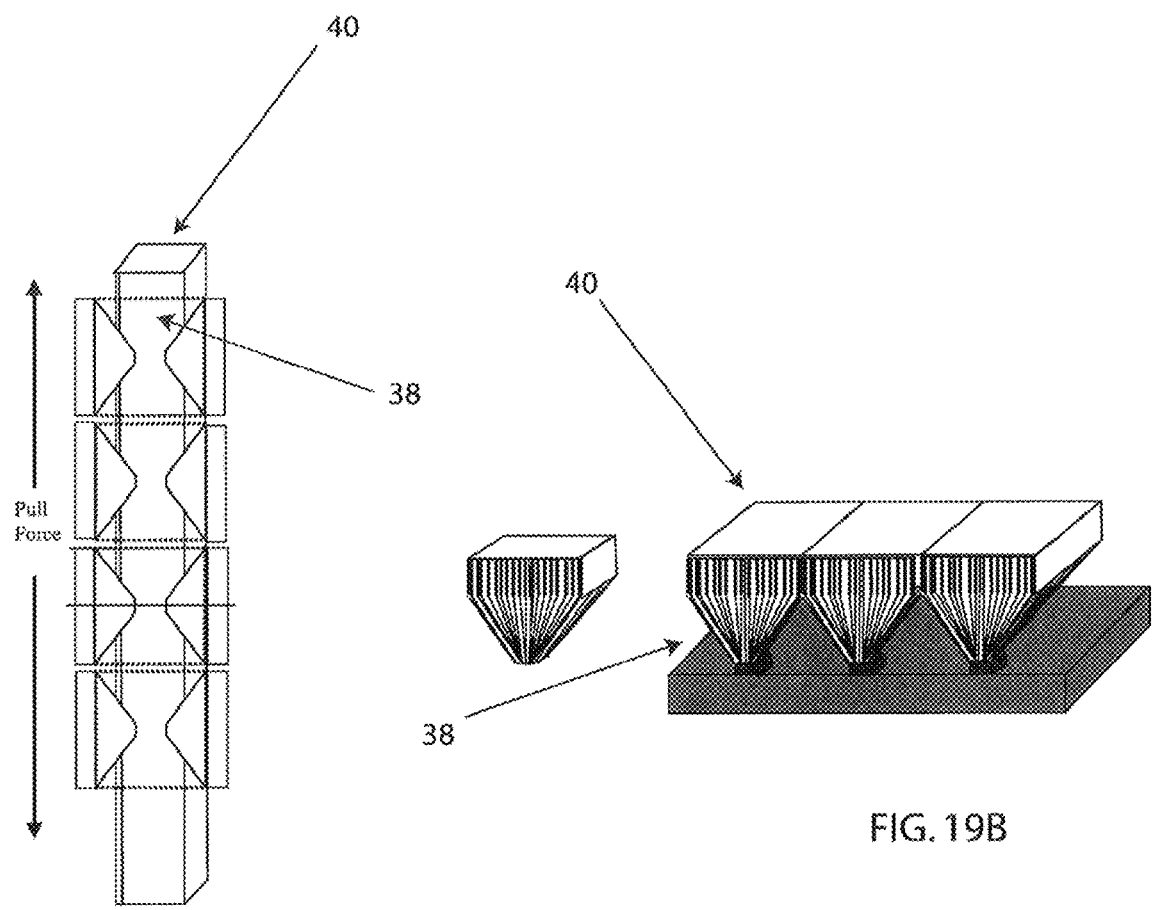
FIG. 19A depicts a schematic view of an embodiment of a discrete unit being pulled and/or stretched.
FIG. 19B depicts a schematic view of an embodiment of photoluminescent color converter matrix bundles.

FIG. 19A depicts an embodiment of an example process and design for tapered 38 photoluminescent color converter matrix 40 bundles using a plurality of discrete units 50, such as fibers or ribbons. Column of dyed and undyed dual or triple coated polymer fibers and/or dyes with hot anvils may be positioned to form a photoluminescent color converter matrix 40. The fibers may be heated and pulled, and may consist of different shapes, as shown in FIG. 19B. Sections may be pulled and molded, then cut and polished. Moreover, sections may be assembled as needed with light sources. Clear fiber arrays, such as a plurality of transparent discrete units 55 could be added above. One having skill in the art may use a base substrate 11 with optional circuitry and interconnections for multiple LEDs or laser diodes. Filters may be used to minimize light transmission toward rear of arrays (e.g., Dichroic passing blue if blue source light is used). Compressed and stretched coated fibers may be reflective coated to further minimize light loss light. Heated anvils press in on all sides.

Figure 20:
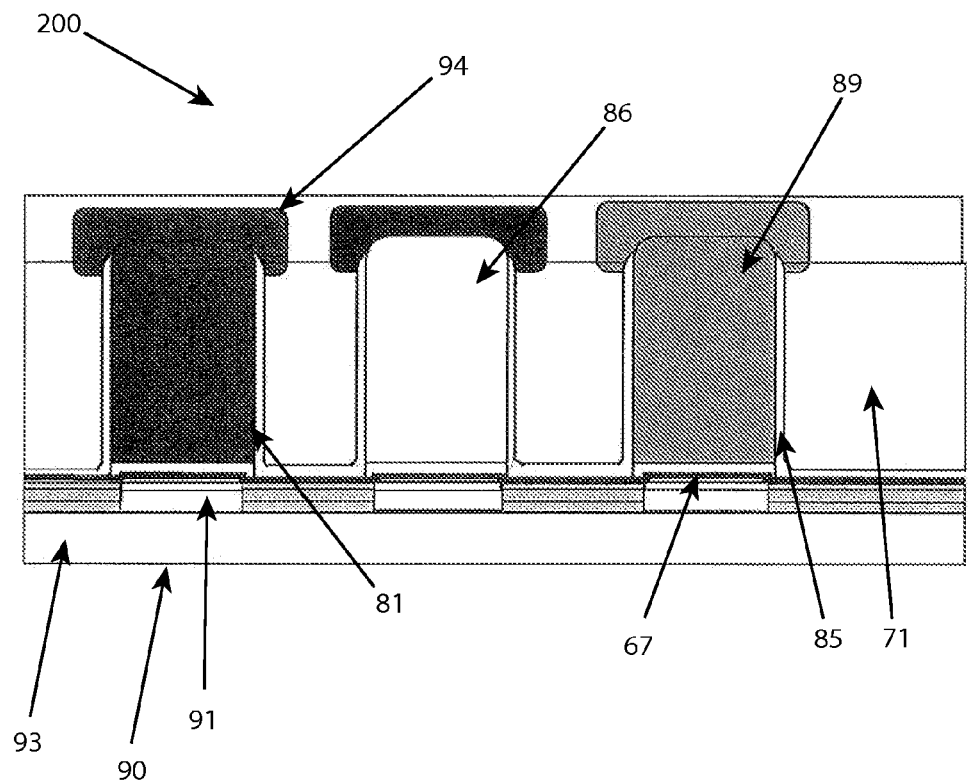
FIG. 20 depicts a cross section view of an embodiment of an imaging or data display implementation of the photoluminescent color converter matrix used with liquid crystal display, Organic LED, and semiconductor technology
Figure 21:
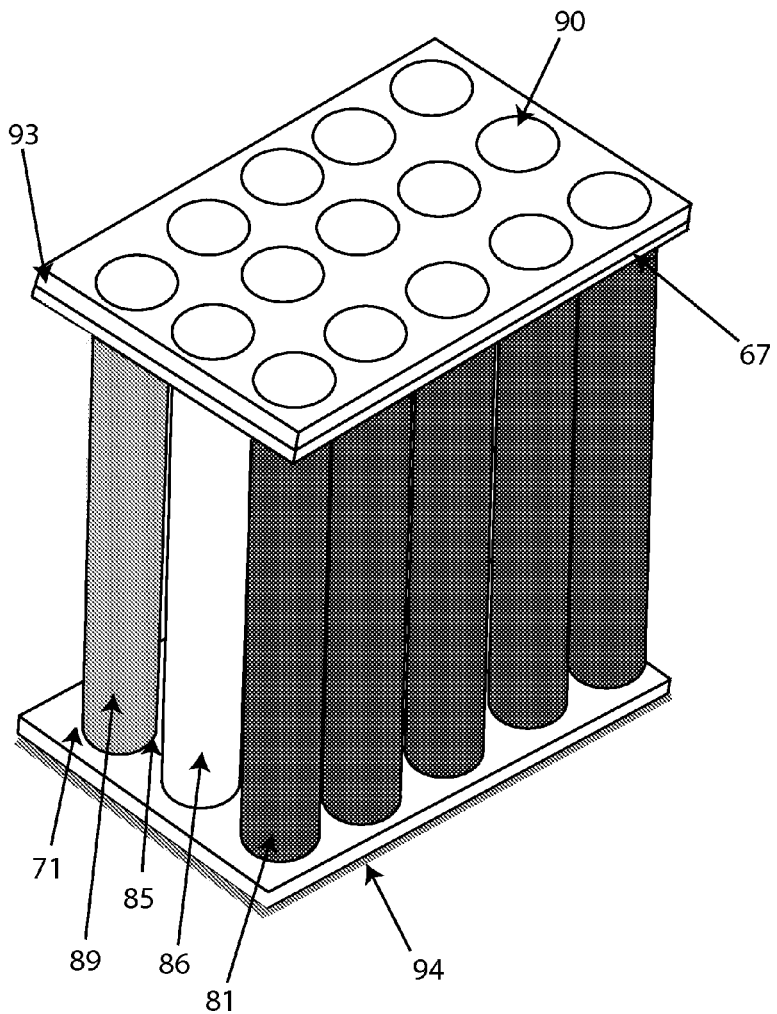
FIG. 21 depicts a perspective view of the embodiment of the imaging or data display implementation of FIG. 20.

FIG. 20 depicts an embodiment of a LCD, OLED, or switched semiconductor implementations 200 of the spectral conversion device 100, 101, 102. Photopatterned or ink jet printed photoluminescent color converter matrix 40 materials may be used for small pixel arrays of this type.

Additionally, organic dye columns, such as discrete units 50, in the form of fibers may be electrolytically grown from solution vertically on a substrate 93 such as glass or a polymer with a conductive base electrode (e.g. ITO, IZO, or a metal) and nucleation sites. Dye dissolved in a solution may be grown into nano and micro fibers on a substrate as it chemically polymerizes the dye in a solution with the nucleation sites and an electrolytic current present. Once nucleated, several polymers can be grown into uniform fibers using electrolytic chemistry and continually recycling the tip of the fiber as it grows while controlling the side growth. While this electrolytic fiber growth process may be used, other growth processes may also be used to grow the fibers and/or organic dye columns.

Nucleation sites may be created with a monomer or precursor to the organic polymer dye material or other material that would easily start the growth of the dye column. These Patterns could be defined lithographically or by nano-imprinting using many equipment and processes known to those having skill in the art. Nucleation sites can be randomly deposited or deposited as to self structure (e.g., spheres or particles of uniform size could be deposited to a high packing density on a substrate and then the nucleation material could be directional evaporation deposited in the gaps between the particles, and then the particles could be removed.) This electrolytic growth process may also work for growing longitudinal nanocrystals of some dyes, such as ionic dyes like some squarines. Once such clear polymer or dye columns are formed on a surface, the microcolumns can be imbedded in a dyed or undyed photoluminescent color converter matrix 40 material. The photoluminescent color converter matrix 40 may be polished on the top or even both sides to expose the tops of the vertical columns. The conductor side of the photoluminescent color converter matrix 40 may or may not require polishing depending on what base is used and type of device being made. Dye columns can be imbedded in a transparent matrix, a dyed matrix, or a solid dye. Sections of different matrix colors with clear columns could provide additional colors. As previously discussed, multiple same color or even different color LEDs can be used to change color, intensity, angles, or light patterns with time. Micro or nano-columns of polymer or dye could be coated with a low, high refractive index films to reduce lateral light loss. Vertical transparent polymer columns with kinks formed in the growth process by changing dye concentrations, chemical additives, temperatures, etc., with time may be used to cause scattering of light from the columns and pump a solid state dye laser. If polished and provided with appropriate mirrors on one end or another, the dye or dye and matrix columns could act as a collective of a very large numbers of dye lasers 80. Low index of refraction thin film coating the dye or dyed columns would aid in pumping and laser luminance lifetime. As discussed in previous sections, various color sections of such a device could be created for a multiple color system with or without separate LEDs and controls, or to create almost any near-visible through visible range color spectrum of light. Higher index of refraction coatings on discrete units 50 or fibers may also be used to increase the amount of light in the coating, which may require putting photoluminescent dye in the coating or fill material for most applications.

Because these grown fibers would typically be used in 1 micron or less in diameter (potentially be under 10 nm or over 100 micron in diameter), they would most likely be used as single mode optical fibers with evanescent characteristics, therefore the type coatings 44, thickness 34, and fill will all interact more since the fibers would typically be less than the wavelength of the light and much of the light energy will be outside the fibers. This provides an opportunity to modify the characteristics of the light using the coatings and/or the fill materials. Like most of the other variations of the new concept embodiments in this document, the nanofiber photoluminescent color converter matrix 40 arrays could be designed with mirrors to be used as a group of lasers or not, could be powered by laser sources, polarized light sources, or incoherent light such as LEDs. These grown nanofibers would generally not be more than a fraction of a millimeter long, but potentially be grown several centimeters long.

Referring again to FIG. 16, the nano or micro-fibers may be grown from a substrate using organic photoluminescent material or dyes in polymer. Pure photoluminescent dyes or high concentration dyes in a polymer may be desired, and may be grown in long filaments at a high filament density. Moreover, PMMA may be an exemplary choice that has been grown into clear fibers, combining that with a high concentration photoluminescent (e.g., 2-10% PL in polymer range). Also, dyes that can be made with built in charge may work best, such as squarine dyes. Fiber diameters may potentially be from under 10 nm to over 100 micron, for example, 20-200 nm diameter. Densities of the filaments may typically be as high or low, as desired for the application. The fibers may have different shapes and sizes, such as a rod or a ribbon. In another embodiment, sheets of the organic photoluminescent materials formed like a book on edge may be used.

Shapes of initial growth may start from pattered nucleation sites by photolithography, deposition and lift off, etching/dissolution of wanted material, or just growing from exposed areas of the nucleation material between the photoresist patterns. Length of the filaments would optimally be at least 1 micron long, but may potentially be many centimeters long.

In one exemplary embodiment, the substrate needs to be transparent, or removable to mount the fibers on a transparent plate. Possible substrates may include glass, sapphire, plastic, and many other translucent or transparent materials. In another one non-limiting example, a uniform electric bias may be needed on the substrate to accelerate growth, ITO, IZO, or some other conductive coated substrates may be acceptable; metal conductors may also be acceptable, if separable after the growth and/or fill process is complete. These sections may resemble carpets or beds of nails, some may be filled to hold the fibers in place and induce internal reflection in the fibers.

The small amount of space between the fibers may be filled with a lower index of refraction material than the selected fiber polymer. In one embodiment, PTFE might be used. In other embodiments, similar materials used for coating plastic fibers for fiber optics may be used. In another embodiment, other fillers known to those having skill in the art, including other photoluminescent materials and multiple coatings or fillers, may also be used. After filling between the fibers, the surface may be polished to expose the ends of the fibers. If separated from the substrate, the fibers may be metal or multiple dielectrics coated to be reflective on one side, and made half mirror coated on the other side. The material in between the mirror side fibers may be removed to allow light in between the fibers to allow pumping of the device. Alternatively, the ends may be uncoated and used as a non coherent color converter and/or light collimator.

A nanofiber laser design may be similar to the manner of design for macro fibers. The mirrors may become more difficult to control as the fibers get smaller. In particular, a 10-20 nm fiber may need to have thin film dichroic or metal mirrors.

Additionally, most embodiments of the spectral conversion device 100, 101, 102 may help and/or eliminate the problem of controlling color of LED's from batch to batch; the problem may occur at the manufacturing stage. Small differences in LED color may cause or lead to mismatched displays and color shifts which may occur after aging. The manufacturing variations may force expensive binning of colors, and aging of the color may make repairs or replacements of lamps in multiple lamp systems increasingly difficult. As will be appreciated by one having skill in the art, the present invention may solve this problem, rendering small differences in the input spectrum occurred. Moreover, variations in LED or laser color due to manufacturing variations or aging of the color may be eliminated. Specifically, using a short wavelength LED, (e.g. ~405 nm LED or laser), one having skill in the art may use a blue converter with the desired properties so that only converted light is emitted, instead of the clear sections. Because the components of the present invention uniquely extinguish all of the incoming light spectrum, the output light spectrum would not significantly change when small differences in the input spectrum occurred. Furthermore, as a material ages with long term source light exposure, minimal output spectral change occurs because the light must still go through a long 100% extinction zone with high transmittance to the emitted wavelengths that minimally interact with organic photoluminescent materials having the characteristics in accordance with the present invention. Letting the blue light through using clear areas, a partial sensitivity to variations in incoming light spectra may occur. Any of the units (fibers or ribbons) of the color converter or coatings could be made blue if a shorter wavelength light source is used.

Furthermore, the use of very high speed switching with W:WO2 and switching electrodes to switch polarization or various part of or all of light sources on and off at various output portions of photoluminescent color converter matrices 40 can enable high speed polarization switching for imaging and analysis. Even without spectral conversion, this can be used to provide high speed analytical capabilities. Polarization at various orientations can be implemented using standard means before the photoluminescent color converter matrix 40 with optical fibers that maintain polarization.

Furthermore, spectral converters that convert part of the input light to infrared, or added infrared LEDs may be used to provide heating of liquid crystal based displays for: 1) faster start up when the temperature is cold, 2) maintaining the temperature of the liquid crystal material for switching speed and/or contrast performance in cold conditions, and/or warm/defog optics at cold temperatures, and 3) providing controlled warmth to the user. Accordingly, this type of conversion to heat liquid crystal may be useful for faster turn on and stabilization of LCD displays or to control the temperature of electrochromic switches such as tungsten doped vanadium oxide. Specifically, the infrared (IR) spectrum may be selected to be absorbed by the liquid crystal or other light switch material, or an additive or coating may be provided to increase the absorption of the chosen IR spectrum. These sources may be used at cold start up and the intensity may be controlled based on the temperature or performance feedback of the liquid crystal or other light switching material. For example, infrared (IR) spectral converter material units may be added to the photoluminescent color converter matrix 40 or added as separate units as controlled IR sources to permit heating of liquid crystal material and/or other light switching materials such as tungsten doped vanadium oxide to permit operation at cold temperatures. This may include the optional use of temperature and performance feedback control mechanisms to permit control of the light switching medium temperature, and the additional of additives or coatings to enhance absorption of the IR at the active switching element of the display. These IR units may be individually controlled, or left as a part of the lighting power in the photoluminescent color converter matrix 40 as desired. These IR units can also be separately arranged to provide IR or near-IR sources for non-obtrusive eye tracking in near eye systems, and/or to feed reflected light from the eye surface in a near-IR or IR camera or sensor array based tracking system to determine eye position and view direction.

Referring to FIGS. 1-20, a method of improving life and efficiency of spectral conversion may include the steps of providing a plurality of discrete units 50, the plurality of discrete units 50 including transparent discrete units 55 and dyed discrete units 51, dying the dyed discrete units 51 with a photoluminescent material at a concentration greater than or equal to an amount sufficient to absorb and convert substantially all input light 21 from a light source 20 to a desired output spectrum, 25 providing a coating material around the plurality of discrete units 50, wherein the coating material binds the plurality of discrete units 50 to form a matrix 40, further wherein a thickness of the coating material determines the distance between each of the plurality of discrete units 50, and positioning the plurality of discrete units 50 proximate the light source 20, wherein the input light 21 passing through the transparent discrete units 50 is not converted, and the input light 21 passing through the dyed discrete units 51 is converted to red and green wavelengths 25, further wherein the emitted input light 21 and the converted red and green light 25 correspond to the desired output spectrum to produce one or more colors.

While this detailed description has been described in conjunction with the specific embodiments outlined above, it is evident that many alternatives, modifications and variations will be apparent to those skilled in the art. Accordingly, the preferred embodiments of the detailed description as set forth above are intended to be illustrative, not limiting. Various changes may be made without departing from the spirit and scope of the invention as defined in the following claims. The claims provide the scope of the coverage of the invention and should not be limited to the specific examples provided herein.

What is claimed is:

1. A spectral conversion device comprising:
   a plurality of discrete units, the plurality of discrete units including transparent discrete units and dyed discrete units, wherein the dyed discrete units are dyed with a photoluminescent material at a concentration greater than or equal to an amount sufficient to absorb and convert substantially all input light from a light source to a desired output spectrum; and
   a coating material disposed around the plurality of discrete units, wherein the coating material binds the plurality of discrete units to form a matrix, further wherein a thickness of the coating material determines the distance between each of the plurality of discrete units;
   wherein when the plurality of discrete units are positioned over the light source, the input light passing through the transparent discrete units is not converted, and the input light passing through the dyed discrete units is converted, further wherein the emitted input light and the converted input light correspond to the desired output spectrum to produce one or more colors.

2. The spectral conversion device of claim 1, wherein the concentration of photoluminescent material is greater than or equal to 0.02% photoluminescent material in each of the dyed discrete units.

3. The spectral conversion device of claim 1, wherein the converted input light includes green light wavelengths and red light wavelengths.

4. The spectral conversion device of claim 1, wherein the total amount of photoluminescent dye will not photo degrade below a certain total amount during the targeted life of the matrix, thereby avoiding a failure to absorb and convert substantially all input light to the desired output spectrum.

5. The spectral conversion device of claim 1, wherein the plurality of discrete units are optical fibers having a thickness or a diameter and a length, wherein the thickness, the diameter and the length may vary in each of the plurality of discrete units.

6. The spectral conversion device of claim 1, wherein the plurality of discrete units are ribbons.

7. The spectral conversion device of claim 1, wherein the plurality of discrete units are pellets.

8. The spectral conversion device of claim 1, wherein the coating material has a higher index of refraction than each of the plurality of discrete units.

9. The spectral conversion device of claim 1, wherein the light source is a light emitting diode providing blue or violet light.

10. The spectral conversion device of claim 9, wherein the light source includes visible and non-visible electromagnetic radiation.

11. The spectral conversion device of claim 1, wherein the photoluminescent material is an organic photoluminescent material, the organic photoluminescent dye having high quantum efficiency fluorescent properties.

12. The spectral conversion device of claim 11, wherein the organic photoluminescent material are selected from the group consisting of: perylene, squarine, naphthaltic acid, polyfluorine derivative based photoluminescent compound, rotaxane, and cucurbituril.

13. The spectral conversion device of claim 1, wherein the dyed discrete units include two or more photoluminescent dyes mixed or layered to narrow the desired output spectrum, the two or more photoluminescent dyes having a concentration greater than or equal to ten times the amount needed to extinguish all of the input light.

14. The spectral conversion device of claim 1, wherein some of the plurality of discrete units provide an alternate optical pathway to vary the desired output spectrum or create an additional color spectrum.

15. The spectral conversion device of claim 1, wherein the plurality of discrete units are positioned proximate multiple light sources, wherein at least one of the multiple light sources is a blue light source.

16. The spectral conversion device of claim 1, wherein the transparent discrete units are coated with a first material having a low index of refraction and a second material having an index of refraction lower than the first material, wherein the first material is applied prior to the second material.

17. The spectral conversion device of claim 1, wherein a portion of each of the plurality of discrete units is not dyed with the photoluminescent material for added efficiency and collimation of light.

18. The spectral conversion device of claim 1, wherein the photoluminescent material is intentionally photodegraded with high intensity light of an appropriate wavelength to rapidly photodegrade the photoluminescent material in the dyed discrete units from a portion of the dyed discrete units for added efficiency and collimation of light.

19. The spectral conversion device of claim 1, wherein a reflective filter is positioned proximate an end of the plurality of discrete units which accepts the input light to pass the input light but reflect wavelengths back into the plurality of discrete units to permit shallower angles to be used with or without the use of beveled ends, permitting the desired output spectrum to reenter the plurality of discrete units.

20. The optic spectral conversion device of claim 19, wherein the reflective filter is a dichroic filter.

21. The spectral conversion device of claim 1, wherein the input light is provided at an angle to the sides or base of the plurality of discrete units at a location above the point where a significant amount of the light would be reflected off the surfaces of the plurality of discrete units.

22. The spectral conversion device of claim 1, wherein a bottom portion of the plurality of discrete units are tapered.

23. The spectral conversion device of claim 1, wherein the bottom portion of the plurality of discrete units is a highly reflective surface, and an upper portion of the plurality of discrete units is a less reflective surface than the bottom portion, allowing transmission of light.

24. The spectral conversion device of claim 1, wherein the plurality of discrete units act as organic dye lasers, wherein an input pumping light is used as a pulsed laser scanned by at least one input light source, further wherein the plurality of discrete units are switched in secession so at least one discrete unit some units is in an on position.

25. A spectral conversion device comprising:
one or more photoluminescent color conversion matrices corresponding to an individual color element of an image display device having a plurality of light switches, wherein the one or more photoluminescent matrices provide an output spectrum for the corresponding individual color element;
wherein the photoluminescent color conversion matrices include a plurality of discrete units, the plurality of discrete units including transparent discrete units and dyed discrete units, wherein the dyed discrete units are dyed with a photoluminescent material at a concentration greater than or equal to an amount sufficient to absorb and convert substantially all input light from a light source to a desired output spectrum, and a coating material disposed around the plurality of discrete units, wherein the coating material binds the plurality of discrete units to form the color conversion matrix, further wherein a thickness of the coating material determines the distance between each of the plurality of discrete units.

26. The spectral conversion device of claim 25, wherein the image display device is a liquid crystal display.

27. The spectral conversion device of claim 25, wherein the individual color elements represent a pixel or sub-pixel.

28. The spectral conversion device of claim 25, wherein the individual color elements of the image display device include photonic lattice patterns, selective dichroic filters, and absorbing color filters.

29. The spectral conversion device of claim 28, wherein the plurality of discrete units of each of the one or more photoluminescent color conversion matrices are arranged to form a photonic lattice design to add additional control over the desired output spectrum width, dominant color, efficiency, angle of light emission, and other optical properties in one or more regions of the image display device.

30. The spectral conversion device of claim 25, wherein the light switches are high-speed optical switches operably associated with the plurality of discrete units of the one or more photoluminescent color conversion matrices.

31. The spectral conversion device of claim 25, wherein the plurality of discrete units, with or without the photoluminescent material, are arranged to amplify a spectrum shift and a shift of the polarization of light due to evanescent interactions of light in alternating portions of the one or more color conversion matrices.

32. The spectral conversion device of claim 25, further includes:

an array of ribbons with or without the photoluminescent material that are grown from random, self-organized, or patterned seed patterns using charged and/or polar molecules during the growth process to minimize sideways growth and where the light is introduced into alternating sections to induce large scale evanescent wave light interactions, wherein characteristics of the large scale evanescent wave light interaction are modified with changeable electrical, magnetic fields, or light switches through direct interactions or indirectly through interaction with various coatings.

33. The spectral conversion device of claim 25, wherein a cooling means is provided to the one or more color conversion matrices.

34. A method of improving life and efficiency of spectral conversion comprising:

providing a plurality of discrete units, the plurality of discrete units including transparent discrete units and dyed discrete units;

dying the dyed discrete units with a photoluminescent material at a concentration greater than or equal to an amount sufficient to absorb and convert substantially all input light from a light source to a desired output spectrum;

providing a coating material around the plurality of discrete units, wherein the coating material binds the plurality of discrete units to form a matrix, further wherein a thickness of the coating material determines the distance between each of the plurality of discrete units; and positioning the plurality of discrete units proximate the light source, wherein the input light passing through the transparent discrete units is not converted, and the input light passing through the dyed discrete units is converted, further wherein the emitted input light and the converted input light correspond to the desired output spectrum to produce one or more colors.

35. The method of claim 34, wherein the concentration of photoluminescent material is greater than or equal to 0.02% photoluminescent material in each of the dyed discrete units.

36. The method of claim 34, wherein the light source is a light emitting diode providing blue or violet light.

37. The method of claim 34, wherein the photoluminescent dye will not photo degrade below a certain concentration during the targeted life of the matrix that will fail to absorb and convert substantially all input light.

38. The method of claim 34, wherein the plurality of discrete units are optical fibers having a thickness and a length, wherein the thickness and length may vary from each of the plurality of discrete units.

39. The method of claim 34, wherein the photoluminescent material is an organic photoluminescent material, the organic photoluminescent dye having high quantum efficiency fluorescent properties.

40. The method of claim 34, wherein the plurality of discrete units are positioned proximate multiple light sources, wherein at least one of the multiple light sources is a blue light source.

41. The method of claim 34, wherein the plurality of discrete units are operably associated with flat panel image display devices.

42. The method of claim 34, wherein the converted input light includes ultraviolet, green, and red light wavelengths.

* * * * *

UNITED STATES PATENT AND TRADEMARK OFFICE
CERTIFICATE OF CORRECTION

PATENT NO. : 8,724,054 B2  
APPLICATION NO. : 12/788680  
DATED : May 13, 2014  
INVENTOR(S) : Gary Wayne Jones Page 1 of 1

It is certified that error appears in the above-identified patent and that said Letters Patent is hereby corrected as shown below:

In the Specification:

COLUMN 4

Line 27, after "technology" insert -- ; --

COLUMN 14

Line 6, delete "5C" and insert -- 5C-5E --

COLUMN 24

Line 42, after "filters" insert -- 94 --

Line 43, after "filters" insert -- 94 --

In the Claims:

COLUMN 32

Line 21, after "unit" delete "some units"

Signed and Sealed this
Fourteenth Day of October, 2014

Michelle K. Lee
*Deputy Director of the United States Patent and Trademark Office*